(12) United States Patent
Karayianni et al.

(10) Patent No.: US 7,849,888 B2
(45) Date of Patent: Dec. 14, 2010

(54) SURFACE FUNCTIONAL ELECTRO-TEXTILE WITH FUNCTIONALITY MODULATION CAPABILITY, METHODS FOR MAKING THE SAME, AND APPLICATIONS INCORPORATING THE SAME

(75) Inventors: Eleni Karayianni, Geneva (CH); Eduardo Munoz, Dingy en Vuache (FR); George W. Coulston, Pittsburgh, PA (US); Stacey B. Burr, Wilmington, DE (US); Thomas A. Micka, West Grove, PA (US)

(73) Assignee: Textronics, Inc., Wilmington, DE (US)

( * ) Notice: Subject to any disclaimer, the term of this patent is extended or adjusted under 35 U.S.C. 154(b) by 37 days.

(21) Appl. No.: 12/389,932

(22) Filed: Feb. 20, 2009

(65) Prior Publication Data

US 2009/0159149 A1 Jun. 25, 2009

Related U.S. Application Data

(62) Division of application No. 11/150,525, filed on Jun. 10, 2005.

(51) Int. Cl.
*D03D 15/08* (2006.01)
*D03D 15/06* (2006.01)
*D03D 23/00* (2006.01)

(52) U.S. Cl. .................. 139/426 R; 139/421; 139/422; 139/420 R; 139/425 R; 139/383 R

(58) Field of Classification Search ............. 139/383 R, 139/420 R, 421, 422, 425 R, 426 R, 420 A
See application file for complete search history.

(56) References Cited

U.S. PATENT DOCUMENTS

| | | | | |
|---|---|---|---|---|
| 2,199,446 A | * | 5/1940 | Ruben | 361/509 |
| 2,412,562 A | * | 12/1946 | Crawshaw | 139/425 R |
| 3,266,865 A | * | 8/1966 | Runton | 8/115.7 |
| 3,273,978 A | | 9/1966 | Victor | |
| 3,288,175 A | | 11/1966 | Valko | |
| 3,300,767 A | * | 1/1967 | Davis et al. | 365/70 |
| 3,336,174 A | | 8/1967 | Dyer et al. | |
| 3,354,630 A | | 11/1967 | Segal | |
| 3,586,597 A | * | 6/1971 | Okuhashi | 442/187 |
| 3,625,809 A | | 12/1971 | Caroselli et al. | |
| 3,699,590 A | * | 10/1972 | Webber et al. | 361/220 |
| 3,909,508 A | * | 9/1975 | Ross | 174/117 M |
| 3,979,648 A | | 9/1976 | Toyoshima et al. | |
| 4,160,711 A | | 7/1979 | Nishizawa et al. | |

(Continued)

FOREIGN PATENT DOCUMENTS

EP 1 319 741 6/2003

(Continued)

*Primary Examiner*—Bobby H Muromoto, Jr.
(74) *Attorney, Agent, or Firm*—Connolly Bove Lodge & Hutz LLP

(57) ABSTRACT

A surface functional electro-textile fabric incorporates energy-active, electrically conductive or optically conductive fibers and nonconductive fibers in a woven or knitted textile fabric. The weave or knit pattern is selected so as to form floats of the electrically conductive fibers on at least one surface of the electro-textile fabric. The electro-textile fabric can be incorporated into an antenna structure that interacts with high frequency electromagnetic radiation, particularly in the frequency range of DC to 100 GHz.

8 Claims, 14 Drawing Sheets

U.S. PATENT DOCUMENTS

| | | | |
|---|---|---|---|
| 4,226,076 A | 10/1980 | Griset, Jr. | |
| 4,228,641 A | 10/1980 | O'Neil | |
| 4,234,907 A | 11/1980 | Daniel | |
| 4,239,046 A | 12/1980 | Ong | |
| 4,299,884 A | 11/1981 | Payen et al. | |
| 4,433,536 A | 2/1984 | O'Neil | |
| 4,525,992 A | 7/1985 | Payen et al. | |
| 4,544,603 A | 10/1985 | Richards | |
| 4,572,960 A | 2/1986 | Ebneth et al. | |
| 4,583,547 A | 4/1986 | Granek et al. | |
| 4,651,163 A | 3/1987 | Sutera et al. | |
| 4,654,748 A | 3/1987 | Rees | |
| 4,777,789 A | 10/1988 | Kolmes et al. | |
| 4,813,219 A | 3/1989 | Rees | |
| 4,813,459 A * | 3/1989 | Breidegam | 139/421 |
| 4,878,148 A | 10/1989 | Hee et al. | |
| 4,885,663 A | 12/1989 | Parker | |
| 4,907,132 A | 3/1990 | Parker | |
| 4,929,803 A | 5/1990 | Yoshida et al. | |
| 5,042,900 A | 8/1991 | Parker | |
| 5,102,727 A | 4/1992 | Pittman et al. | |
| 5,103,504 A | 4/1992 | Dordevic | |
| 5,275,861 A | 1/1994 | Vaughn | |
| 5,288,544 A | 2/1994 | Mallen et al. | |
| 5,503,887 A | 4/1996 | Diaz et al. | |
| 5,568,964 A | 10/1996 | Parker et al. | |
| 5,632,137 A | 5/1997 | Kolmes et al. | |
| 5,771,027 A | 6/1998 | Marks et al. | |
| 5,906,004 A * | 5/1999 | Lebby et al. | 2/1 |
| 5,910,361 A | 6/1999 | Guevel et al. | |
| 5,927,060 A | 7/1999 | Watson | |
| 5,968,854 A | 10/1999 | Akopian et al. | |
| 6,105,224 A | 8/2000 | O'Mara, Jr. et al. | |
| 6,138,336 A | 10/2000 | Goineau | |
| 6,145,551 A | 11/2000 | Jayaraman et al. | |
| 6,341,504 B1 | 1/2002 | Istook | |
| 6,348,116 B1 * | 2/2002 | Lim et al. | 156/148 |
| 6,356,238 B1 | 3/2002 | Gainor et al. | |
| 6,377,216 B1 | 4/2002 | Cheadle et al. | |
| 6,381,482 B1 * | 4/2002 | Jayaraman et al. | 600/388 |
| 6,399,879 B1 | 6/2002 | Ueda et al. | |
| 6,519,979 B2 | 2/2003 | Freedman | |
| 6,581,366 B1 | 6/2003 | Andrews | |
| 6,677,917 B2 | 1/2004 | Van Heerden et al. | |
| 6,680,707 B2 | 1/2004 | Allen et al. | |
| 6,701,703 B2 | 3/2004 | Patrick | |
| 6,738,265 B1 | 5/2004 | Svarfvar et al. | |
| 6,803,332 B2 | 10/2004 | Andrews | |
| 6,856,715 B1 | 2/2005 | Ebbesen et al. | |
| 6,941,775 B2 * | 9/2005 | Sharma | 66/202 |
| 6,970,731 B1 | 11/2005 | Jayaraman et al. | |
| 7,059,714 B2 | 6/2006 | Kaeding et al. | |
| 7,135,227 B2 | 11/2006 | Karayianni et al. | |
| 7,147,904 B1 | 12/2006 | Crawford | |
| 7,240,522 B2 | 7/2007 | Kondou et al. | |
| 7,413,802 B2 | 8/2008 | Karayianni et al. | |
| 7,504,127 B2 | 3/2009 | Karayianni et al. | |
| 2002/0050446 A1 | 5/2002 | Antoniazzi | |
| 2002/0130624 A1 | 9/2002 | Nakamura | |
| 2002/0189839 A1 | 12/2002 | Wagner et al. | |
| 2003/0224681 A1 * | 12/2003 | Koch | 442/131 |
| 2004/0023576 A1 | 2/2004 | Rock et al. | |
| 2004/0038609 A1 * | 2/2004 | Mayer | 442/123 |
| 2004/0171284 A1 | 9/2004 | Sweetland et al. | |
| 2004/0209059 A1 | 10/2004 | Foss | |
| 2004/0216287 A1 | 11/2004 | Bakker et al. | |
| 2004/0235381 A1 | 11/2004 | Iwasaki et al. | |
| 2004/0237494 A1 | 12/2004 | Karayianni et al. | |
| 2005/0118914 A1 * | 6/2005 | Kuo et al. | 442/301 |
| 2005/0282009 A1 | 12/2005 | Nusko et al. | |

FOREIGN PATENT DOCUMENTS

| | | |
|---|---|---|
| FR | 2 745 690 | 9/1997 |
| GB | 2156592 | 10/1985 |
| WO | WO-92/13352 | 8/1992 |
| WO | WO-01/02052 A2 | 1/2001 |
| WO | WO-01/37366 A1 | 5/2001 |
| WO | WO-01/39326 A1 | 5/2001 |
| WO | WO-02/071935 A1 | 9/2002 |
| WO | WO-03/094717 A1 | 11/2003 |
| WO | WO-2004/006700 A1 | 1/2004 |
| WO | WO-2004/027132 | 4/2004 |
| WO | WO-2004/058346 A1 | 7/2004 |
| WO | WO-2004100784 A2 | 11/2004 |

* cited by examiner warp
weft

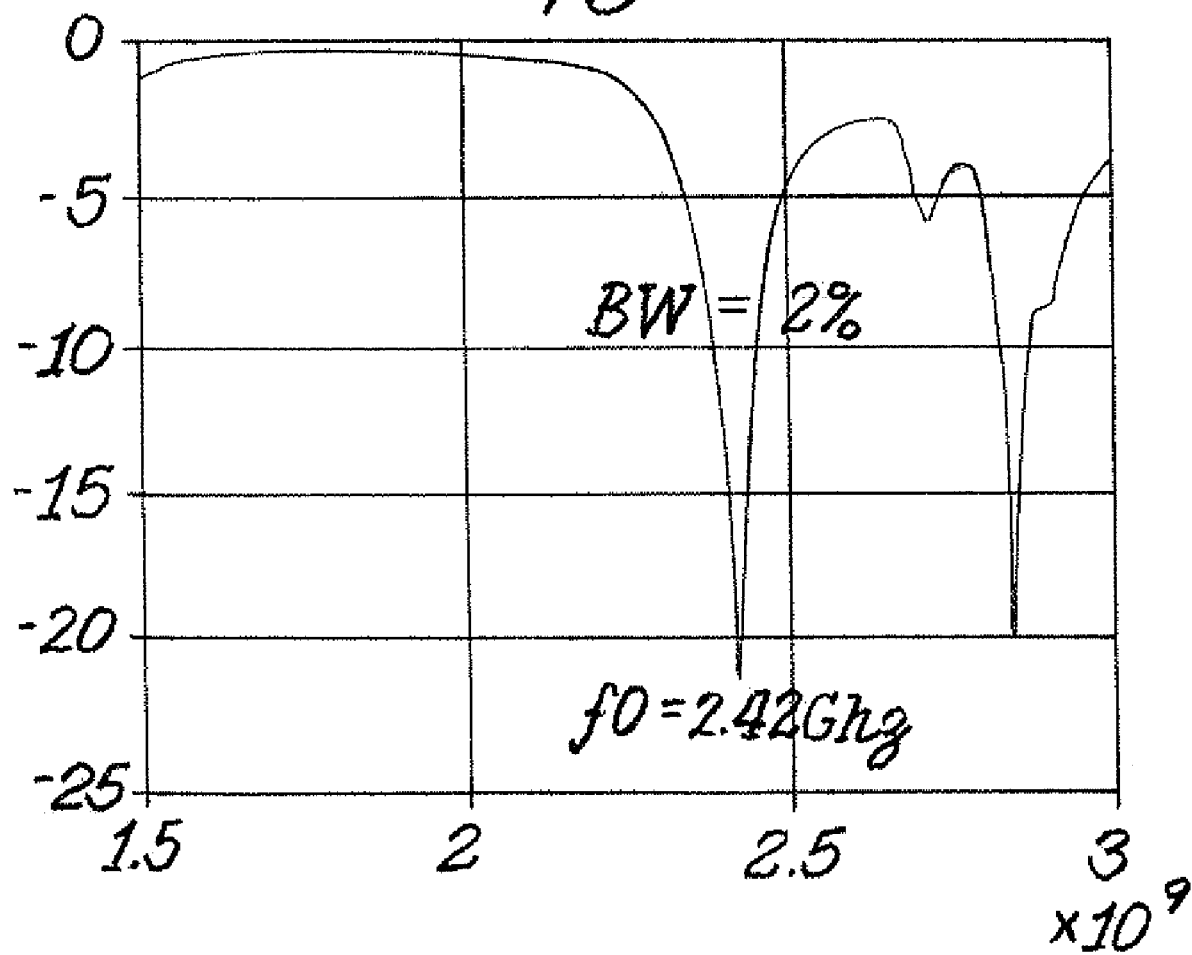

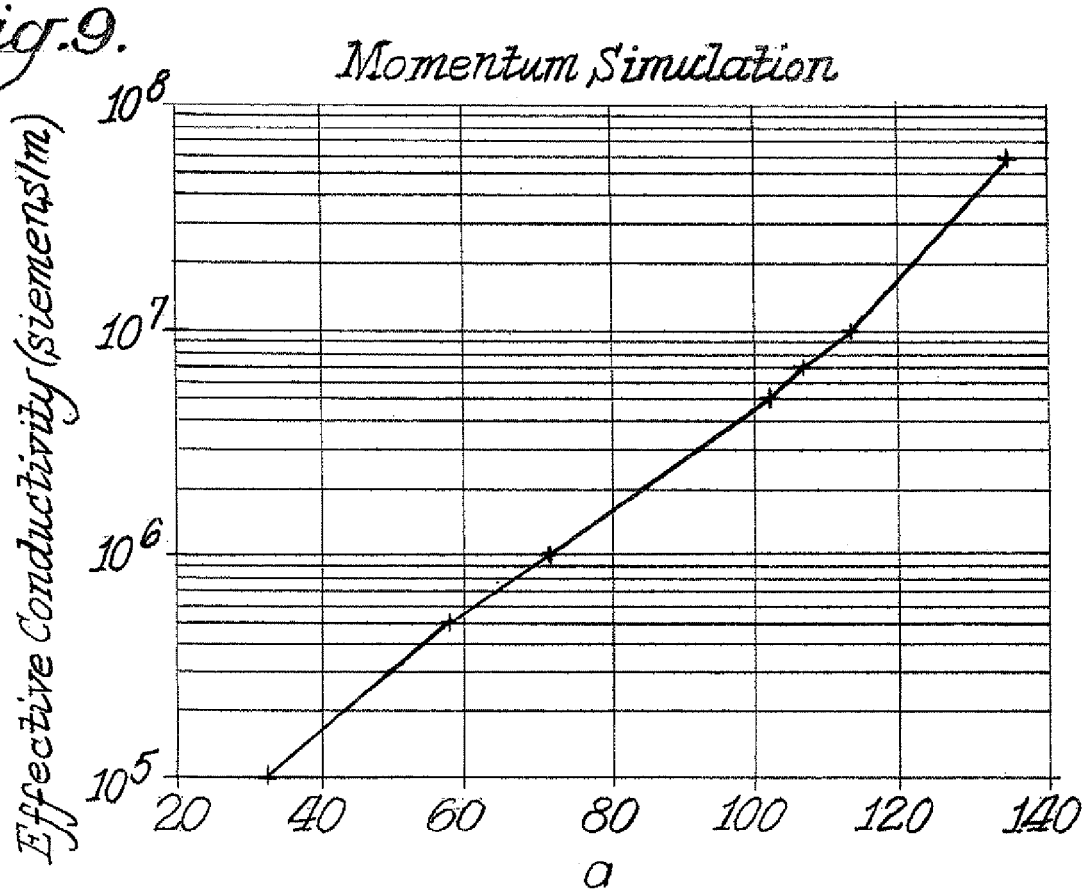
Fig. 9. Momentum Simulation
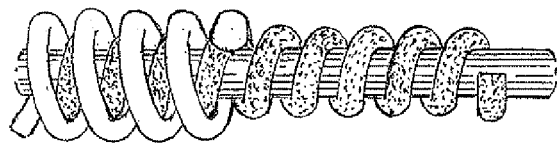
Fig. 12.

SURFACE FUNCTIONAL ELECTRO-TEXTILE WITH FUNCTIONALITY MODULATION CAPABILITY, METHODS FOR MAKING THE SAME, AND APPLICATIONS INCORPORATING THE SAME

CROSS-REFERENCE TO RELATED APPLICATION

This application is a divisional of U.S. patent application Ser. No. 11/150,525, filed Jun. 10, 2005, now pending.

FIELD OF THE INVENTION

The present invention relates to an electro-textile fabric that comprises energy-active functional filaments and electrically non-conductive standard textile filaments and to an electro-textile antenna structure fabricated in the form of a woven textile for interacting with high frequency electromagnetic radiation, particularly radiation in the frequency range of wireless communication.

BACKGROUND OF THE INVENTION

A. Electro-Textile Fabrics

It is known to employ textiles as the means for providing electronic functionalities. Smart textiles or electro-textiles provide the features of flexibility, structure and large area capability and therefore find unique applications as substrates for carrying functional attributes. Example applications include: wearable electronics, monitoring of physiological signs through interaction with the human body, heating, sensing, and energy storage.

As compared to the traditional hard-wired electronic circuits and integrated systems, textiles are not considered conventional substrates for providing energy-active functionalities. However, many research efforts are currently under way to create suitable electro-textile systems that can respond with high efficiency to the requirements of these types of circuits and systems.

It is known to employ textiles as a means for providing a shielding against any electromagnetic interference (EMI) radiation energy generated by an electronic device. An ideal EMI shield is one that includes an infinitely-conductive material. Generally the shielding effectiveness is improved when the largest dimension of the aperture is small compared to the radiation energy wavelength (e.g., less than 1/20th of the wavelength). Shielding effectiveness of typical materials and methods decreases with increasing frequency. Textiles that display a high conductivity in the low to high frequency range, including frequencies from DC up to 100 GHz, find uses in electromagnetic shielding applications, as well as in the construction of flexible fabric antennas.

There are three basic types of electro-textile fabrics for EMI shielding protection:

(1) electro-textile fabrics which are surface coated with a metallic coating by a post coating process after making the fabric;

(2) electro-textile fabrics formed entirely from electroconductive yarns; and (3) electro-textile fabrics formed with a combination of typical non-conductive textile fibers and electroconductive yarns.

Type 1 electro-textile fabrics for EMI shielding (e.g., WO 92/13352, U.S. Pat. No. 4,572,960, U.S. Pat. No. 5,275,861) are not ideal as the surface coating may negatively impact the textile properties, such as mechanical properties, flexibility, and aesthetics. In addition, the surface coating may be destroyed during use by abrasion or during movement, in which case the efficiency of the electro-textile as a means for EMI shielding is significantly reduced.

U.S. Pat. No. 6,399,879B1 to Ueda et. al., discloses an electromagnetic shield plate for a visual display that consists of a geometric pattern. The geometric pattern is formed by repeating a single pattern of a polygon or an n-gon (e.g., triangle, square, rectangle, etc.) or a single pattern (e.g., circle, ellipse, star, trefoil or a petal), or by combining two or more of these patterns on a surface of a transparent substrate. The pattern consists of lines formed from an electrically conductive paste, metal, or metal oxide film. The pattern has a line interval (converted to a square pattern) of about 50 to about 250 mesh (number of lines per inch) and a line width of about 10 μm to about 80 μm. The ranges of the line characteristics described above serve to define the optimum visibility for the display screen. It is disclosed that the electromagnetic shielding efficiency is enhanced by: (i) the line thickness (preferably between 1 μm and 30 μm, but not less than 1 μm); and (ii) reducing both the line width (to 40 μm or less) and the line interval.

Type 2 electro-textile fabrics for EMI shielding incorporate conductive fibers within the textile fabric structure, thus avoiding the post-process of applying a surface coating, as in Type 1. In this category, the textile is composed of 100% conductive fibers or the conductive fibers are incorporated within all directions of the textile fabric so as to come in contact with one another.

It is generally known to provide an EMI shield plate by bonding an electrically conductive mesh to a substrate, where the mesh is constructed by weaving an electrically conductive fiber in a grid pattern. However, with this construction, the fabric can contract and expand during fabrication, which makes it difficult to handle, and further can distort the grid pattern.

U.S. Pat. No. 5,103,504 to Dordevic, discloses a woven fabric that comprises orthogonal warp and weft threads. The threads are made of stainless steel fibers of 6-10 μm diameter and textile non-conductive fibers (e.g., cotton) blended together and spun into a composite yarn, such that the content of the steel fibers in the mixed yarn is 10 to 15 wt %. The distribution of the warp and weft threads in the fabric is the same, comprising 18 to 20 threads per cm. The yarn fineness is 30 to 50 tex. Mutual electrical contact exists between the warp and weft threads. The disclosure indicates that shielding of 20 to 40 dB can be achieved at a frequency of 10 gigaHertz (GHz) by this woven fabric.

FR 2745690A1 to Busson et. al., discloses a garment for electromagnetic shielding which comprises, in between the internal and external surface of the garment, at least one layer of an electro-conductive woven or knitted fabric that has stitch openings of less than 2 mm and is made based on electro-conductive fibers including copper fibers and carbon-based fibers, having a diameter on the order of several tens of micrometers.

U.S. Pat. No. 5,968,854 to Akopian et. al., discloses an EMI shielding fabric formed entirely by silver-coated synthetic fiber yarns including nylon yarns. The silver-coated synthetic yarn is disclosed to have a silver content preferably not less than 20% by weight and a conductivity of not less than 1.2 ohms/cm. The preferred fabric based on these yarns is a warp knit fabric that interlocks all the conductive yarns in a series continuous chain stitch so that each yarn is in electrical contact with its adjacent yarns. Other fabrics are also disclosed, such as a woven fabric.

U.S. Pat. No. 6,738,265B1 to Svarfvar et. al., discloses a method for making an EMI shielded portable electronic device. The device includes an electrically conductive woven fiber mesh net comprising a given pattern of woven threads of inter-twisted electrically conductive fibers. More specifically, this includes a bobbinet woven fiber mesh net construction including a 3-directional fiber mesh net having 6 to 34 openings per inch and a specific weight of 10-50 g/m$^2$. Conductive fibers disclosed include fibers, filaments or yarns coated with a thin layer of conductive metal layer (e.g., thickness of 10-10000 nm). The conductive metal layer preferably is a silver, nickel or aluminum layer. The shielding effectiveness of the fiber mesh net depends upon the fiber material and thickness or diameter of the fiber, and is capable of producing a shielding effectiveness of 30 dB at 1 GigaHertz (GHz).

EP1319741A1 to Ward et. al., discloses a bobbinet weave suitable for electromagnetic shielding for a radar location detection. The bobbinet weave has nylon warp threads that extend vertically and two sets of bobbin threads formed of silver-coated nylon yarn provided at two respective inclinations. The bobbin threads pass alternately around the warp threads.

Although these Type 2 electro-textile fabrics are indicated as useful for EMI shielding in a range of frequencies, providing a fabric based on 100% conductive fibers is not ideal in several aspects. For example: (a) metal fibers are heavy; (b) the conductive fibers have mechanical properties that may not allow a fabric to perform across applications; (c) such structures may not be suitable for use alone or for use in an external surface of a textile application; (d) metal and other conductive fibers have higher cost, and (e) aesthetics may prevent use of such structures in wearable textiles.

Type 3 electro-textile fabrics incorporate conductive fibers within the textile fabric in combination with non-conductive textile fibers. These Type 3 electro-textile fabrics do not require the post-process of applying a surface coating. Nor do they include 100% conductive fibers. With Type 3 fabrics it is possible to achieve EMI shielding efficiency equivalent to Type 2 textile fabrics, while avoiding the disadvantages of Type 2 textile fabrics.

U.S. Pat. No. 5,503,887 to Diaz et. al., discloses a conductive woven fabric having a significant conductivity over a range of directions and preferably equal conductivity in all directions. The conductive woven fabric is made with conductive weft or warp fibers only. However, the method for producing the final conductive woven fabric comprises: cutting the fabric in pieces at an angle to the warp direction; and assembling the cut pieces in a way so as the conductive fibers cross with each other at specified angle in all directions. That is, this method requires complex processing, and contact between the conductive fibers is sought in order to achieve the desired efficiency.

US 2004/0235281A1 to Iwasaki et. al., discloses an electromagnetic wave shield cover comprised of conductive and non-conductive yarns running in parallel directions. Both the conductive and non-conductive yarns cross with yarns of the same family within an angle. The conductive yarns are a bundle of fine fibers around which a metal foil is spirally wound. The publication indicates that the cover has a shieldability of 40 dB or more in the range from 30 to 500 MegaHertz (MHz), and of 30 dB or more in the range from 500 to 1000 MegaHertz (MHz).

US 2004/0023576 A1 to Rock et. al., discloses an electrically conductive fabric for use for shielding against electromagnetic radiation. The conductive fabric has a knit body having two opposite surfaces, one of which comprises a fleece or raised surface. The stitch yarns are conductive fibers and the loop yarns are non-conductive fibers that may be elastic non-conductive fibers. The conductive fabric is constructed using standard reverse plating circular knitting. Based on this construction, the non-conductive fibers appear on at least one of the outer surfaces to form the fleece or raised surface, while the conductive fibers are between and spaced from the first and second surfaces. The conductive fibers may have conductivities between $10^3$-$10^9$ Ω/cm and may be spaced symmetrically or asymmetrically along at least a portion of the fabric and comprise 1-20 conductive fibers/cm. The publication indicates that the spacing between the conductive fibers is important to determine the shielding efficiency of the fabric. The conductive fabric may further have conductive buses (e.g., as stitched conductive yarns or narrow tapes) to provide an electrical connection between the conductive fibers. Although the fabric made by this disclosure may have shielding properties, the textile process disclosed is very restrictive, and cannot be applied widely across end-use applications.

US 2003/0224681 A1 to Koch, M., discloses a textile based material as a base for electromagnetic shielding such that the textile forms a frequency selective shielding of electromagnetic fields. In particular, this publication discloses a textile fabric that has been stitched or embroidered with a continuous filament or thread of electrically conductive material in a symmetrical configuration (e.g., crosses) as well as a uniform, symmetrical distribution. In the case of a cross, the legs of the crosses all have the same length, which is such that the total length of two aligned legs corresponds to a half wavelength of the wave frequency to be reflected. Each cross comprises a single, continuously embroidered filament. The arrangement of the individual crosses is such that: (1) there is no electrical connection between the crosses; and (2) the minimum distance between the crosses is chosen so that there is no influence on the selective frequency. Although this textile may achieve shielding properties, it requires extra processing steps that need accurate parameter controls that cannot be achieved through the fabric construction itself.

B. Electro-Textile Antennas

Antennas are a key component common to any electronic application that requires signal transmission. Current antennas are "hard" and much less flexible than textiles, which limits their use in textile applications.

Due to the large area advantage offered by textiles, there are many research efforts focusing on creating electro-textile antennas by both electronic and textile companies.

A typical antenna of a patch design may comprise metal elements, in the form of conductive plates placed around a dielectric slab. These metal elements prevent the potential deformation of the antenna. However, these metal elements also make the antenna extremely rigid, preventing use in a wearable electronic or as a component in a flexible textile system structure.

U.S. Pat. No. 5,771,027 to Marks et al., discloses a composite, multi-layer laminate, polarizing parabolic dish antenna. One of the layers of the antenna is a polarizing grid comprised of a resin reinforced cloth. The cloth is a woven construction having electrical conductors woven in the warp and parallel to each other. In addition, the number of electrical conductors woven in the warp of the at least one layer of resin reinforced cloth is less than the number of warp fibers in the cloth. The remaining warp and weft yarns of the woven fabric are dielectric yarns, such as Kevlar® and fiberglass. Copper wire may be used for the conductive yarn/fiber.

Further, a composite antenna may be formed to have more than one layer of resin-reinforced cloth arranged so that the electrically conductive fibers of each layer are at predetermined angles relative to each other. However, this antenna consists only partially of a fabric, and is bulky. It is not suitable where an omni-directional capability is required.

Furthermore, it is not always easy to include functional yarns, such as conductive yarns, in the warp direction of the textile. That is, the warp yarns require extreme mechanical properties to withstand the warping process. Moreover, substituting the warp yarns with both conductive and non-conductive yarns, especially when control is needed on the spacing of the warp fibers, is time-consuming and not a straightforward effort.

U.S. Pat. No. 5,906,004 to Lebby et al., discloses a textile fabric with integrated electrically conductive fibers capable of conducting electromagnetic radiation and inducing wired and wireless coupling between a textile fabric and a portable electronic device. The disclosure refers to a woven textile where the electrically conducting fibers and the non-electrically conducting fibers are woven in orthogonal directions, thereby providing individual addressing of each of the electrically conducting fibers. U.S. Pat. No. 5,906,004 also discloses a woven textile where the electrically conducting fibers are woven in orthogonal directions thereby defining a plurality of cross-over points. In addition, this textile fabric is disclosed for use as a textile antenna for the transmission and receipt of electromagnetic signals.

U.S. Pat. No. 6,377,216 B1 to Cheadle et al., discloses an all-fabric, flexible, rectangular patch antenna in a bonded 3-layer fabric configuration that includes a top layer antenna, a middle layer, a dielectric and a bottom layer as the ground plane for the antenna. The top and bottom layers are each formed from pieces of electromagnetically conductive fabric, such as a metallized fabric or fabric woven with conductive fibers. The dielectric layer is a piece of polyester, cotton, wool, felt, gabardine, Polartec®, Gore-Tex®, chino, broadcloth, or canvas that is electromagnetically non-conductive. Although the disclosed antenna design may lead to an all-fabric textile antenna, the disclosure does not teach about the optimum fabric properties that could lead to an enhancement of the antenna efficiency.

WO 01/37366 A1 to Stephan et al., discloses an antenna comprising a ground plane, a resilient dielectric layer with elastic properties to allow it to attain its original shape after physical distortion disposed on the surface of the ground plane, and a conductive layer coupled to an upper surface of the dielectric layer. The dielectric layer is made with an elastomer material in the form of a lightweight plastic foam or honeycomb. The conductive layer is disclosed as having flexibility that allows it to retain its original shape upon physical distortion and may comprise a thin conductive cloth. The cloth is disclosed to be a metallized fabric, such as the Metallized Fabric Shielding Tape manufactured by 3M Corporation, Minneapolis, Minn.

WO 01/39326A1, to Massey et al., discloses a fabric patch antenna for mobile telecommunications use that can be incorporated into a wearable garment. The disclosed antenna comprises first and second spaced layers of electrically conducting fabric with a layer of insulating fabric between, and a connection between the conducting layers. The conducting layers may consist of a single strip of shaped fabric folded around the insulating layers or may be connected together via sewing with electrically conductive thread, conductive gluing, or similar techniques. One of the conducting layers has a larger area, and is connected as the ground plane of the antenna so as to shield the wearer from the electric fields. The antenna is fed by a coaxial cable or microstrip or another appropriate feed line.

Further, WO 01/39326A1 discloses the relative dimensions of the layers required to create an antenna operating at a central frequency of 925 MegaHertz (MHz) with a 3 dB bandwidth of over 200 MegaHertz (MHz). The disclosure is centered on the design of a fabric patch antenna. Although such a design may be suitable for use as an antenna, the disclosure does not teach the optimum construction of the individual layers of the antenna. However, it is disclosed that a suitable conductive fabric may be a commercially available fabric under the trademark of Shieldex®, which is a woven nylon plated with a layer of copper, silver or nickel.

Furthermore WO 01/39326A1, discloses that a suitable insulating fabric may be typical textile fibers such as acrylic, horse hair, cotton, polyester, wool, and tailor's foam. Moreover, these elements represent a combination of available textile materials and do not represent ideal constructions.

U.S. Pat. No. 6,356,238B1 to Galnor et al., discloses an antenna assembly formed on a vest. The antenna has two conductive regions on the outer surface which are separated by a non-conductive gap. The electrical connection between the electrically conductive portions is provided by a front conducting strip. The electrically conductive material, comprised of a metallized cloth such as a metallized woven fabric as the conductive and ground planes of the antenna, covers the vest, except for the non-conducting band.

U.S. Pat. No. 6,680,707B2 to Allen et al., and U.S. Pat. No. 6,677,917 to Van Heerden et al., disclose fabric antennas to be worn within a garment. The antennas have a top layer and a ground layer made of an electroconductive fabric separated by a dielectric layer. For the electroconductive fabric, a typical woven nylon plated with a layer of copper or silver or nickel is disclosed. For the insulated layers, typical textile materials, such as acrylic, horse hair, cotton, polyester, and wool, or tailor's foam, and, most preferably, open cell foam for breathability purposes are disclosed. An example of a patch antenna made according to these disclosures for use with a GSM 900 MegaHertz (MHz) applications is a quarter wavelength PIFA that showed better than 6 dB return loss in the 880-960 MegaHertz (MHz) area and an efficiency of 70% to 80%.

Low loss conductive fabric is a factor in the performance of a fabric antenna. There is also a high interest in incorporating elastic fabric structures for use in garment-type or 3-D-type antenna applications. Although the current state-of-the-art includes antenna developments based partially or totally on fabrics, none of these developments disclose integrated fabric constructions based on electrically conductive and non-electrically conductive fibers that can lead to high efficiency antennas or applications operating at high frequency applications. Further, there has not been any distinction in the current literature between the performances of an integrated electrically conductive textile in the low frequency versus the high frequency range, except for considerations regarding the appropriate spacing between the conductive fibers.

In view of the foregoing, there is a need in the art to provide electro-textiles (1) with seamlessly integrated, energy-active functional filaments which can achieve the desired functionality at a high level of efficiency by partial incorporation of the functional elements, and (2) which can be processed using traditional textile means. Further, there is a need in the art to provide such electro-textiles with elastic recovery properties that can conform to any shape or requirement for elasticity. Moreover, there is a need in the art for textiles constructed based on these principles that combine the desired features of low cost, ease of process, manufacturing scalability, durability and conformability.

SUMMARY OF THE INVENTION

A. Electro-Textile Fabrics

The present invention is directed to an electro-textile fabric that comprises energy-active functional filaments and electrically non-conductive standard textile filaments. The energy-active functional filaments and the non-conductive textile filaments can be in the form of fibers, yarns, slit strips or ribbons. These filaments are integrated within the textile fabric via textile manufacturing processes that include, but are not limited to, knitting or weaving.

In addition, the present invention is also directed to various methods for forming the energy-active functional electro-textile fabric having "floats" of energy-active functional filaments. The energy-active functional filaments are integrated in the textile fabric in a way as to form floats of functional filaments within the non-conductive textile filaments on the surface of the textile.

One embodiment of the present invention is an electro-textile fabric comprising non-conductive textile filaments and energy-active functional filaments integrated within the textile fabric such that "floats" of energy-active functional filaments are formed on at least a first surface of the electro-textile fabric. Preferably, the floats of energy active functional filaments are distributed in parallel and oriented in at least one of horizontal and vertical directions. Preferably, the floats of energy active functional filaments are distributed either in parallel and oriented in at least one of horizontal, vertical or diagonal directions relative to one another. Alternatively, the floats of energy active functional filaments may be at angles relative to one another. Preferably, the filaments are at least one of elastic and inelastic.

In addition, the electro-textile fabric of the present invention may be applied to multiple applications that include, but are not limited to, capacitive switches for isolating electrical pathways in the textile, textile electrodes, a fiber optic structure, electromechanical actuation, transducers, resistive heating, functional molecule delivery, highly electrical conductive textile, and electromagnetic shielding from DC to 100 GHz.

Another embodiment of the present invention is a method for forming an electro-textile fabric in which non-conductive textile filaments are provided in a warp direction of a textile weaving apparatus and energy active functional textile filaments are provided in a weft direction. The filaments are woven together with a weave pattern that has at least 1/1 interlacing to form the electro-textile fabric, wherein floats of energy-active functional filaments are formed on at least a first surface of the electro-textile fabric.

Another embodiment of the present invention is a method for constructing a woven fabric comprising non-conductive textile filaments in a warp direction and energy-active functional filaments in a weft direction. The order of interlacing of the woven fabric (i.e., weave pattern diagram) is defined so as to provide a construction having an asymmetric number of warp and weft yarn segments on a surface of the woven fabric, as defined at the intersection points between warp and weft yarns within the unit cell of the weave pattern diagram. Preferably, woven patterns suitable for use in this embodiment include, but are not limited to, satin constructions. Preferably, the satin constructions include at least one of satin 4, satin 5, satin 10 and satin 16.

According to this method, a first surface of the woven fabric has a higher number of weft yarn segments as compared to the warp yarn segments in the weave pattern diagram. Thus, this first surface presents "floats" of energy-active functional filaments. A second or opposite surface of the woven fabric has a higher number of warp yarn segments as compared to the weft yarn segments in the weave pattern diagram. Therefore, this second surface presents "floats" of nonconductive textile filaments.

Another embodiment of the present invention is a method for constructing a woven fabric comprising non-conductive textile filaments in a warp direction, and energy-active functional filaments in a weft direction. The order of interlacing of the woven fabric (i.e., weave pattern diagram) is defined so as to provide a construction having an asymmetric number of warp yarn segments and weft yarn segments on the surface of the fabric, as defined at the intersection points between warp and weft yarns within the unit cell of the weave pattern diagram.

According to this method, both surfaces of the fabric have a higher number of weft yarn segments as compared to the warp yarn segments in the weave pattern diagram. Therefore, both surfaces present "floats" of energy-active functional filaments. Preferably, woven patterns suitable for use in this embodiment include, but are not limited to, double-face satin constructions. Preferably, the satin constructions include at least double face satin 4.

Another embodiment of the present invention is a method for constructing a woven fabric comprising non-conductive textile filaments in a warp direction and energy-active functional filaments in a weft direction. The order of interlacing of the fabric (i.e., weave pattern diagram) is defined so as to provide a construction having an asymmetric interlacing pattern in the warp or weft yarn direction. In this case, the number of warp yarn segments and weft yarn segments on the surface of the fabric, as defined at the intersection points between warp yarns and weft yarns within a unit cell of the weave pattern diagram, are at least equal (i.e., 1/1). However, the interlacing pattern is different than 1/1. Preferably, woven patterns suitable for use in this embodiment include, but are not limited to, warp rib, filling rib, basket weave and twill constructions. According to this method, both surfaces of the fabric present "floats" of energy-active functional filaments and "floats" of non-conductive textile filaments.

Yet another embodiment of the present invention is a method of modulating the functionality of the electro-textile fabric that incorporates elastic non-conductive textile filaments and inelastic energy-active textile filaments. The elastic non-conductive textile filaments are tensioned by constructing the weave pattern, and then the tension is released on the elastic filaments (such as by removing the electro-textile fabric from the weaving loom). Alternatively, each of the non-conductive textile filaments and energy-active textile filaments are at least one of elastic and inelastic.

Another embodiment of the present invention is a method of modulating functionality of an electro-textile fabric, comprising: incorporating elastic non-conductive textile filaments into a weaving apparatus; incorporating inelastic energy-active functional filaments into the weaving apparatus, wherein at least one of the non-conductive textile filaments and the energy-active filaments is elastic; tensioning the elastic non-conductive textile filaments; integrating the elastic non-conductive textile filaments and the inelastic energy-active textile filaments by weaving in accordance with a weave pattern; and removing the electro-textile fabric from the weaving apparatus.

Yet another embodiment of the present invention is a method of modulating functionality of an electro-textile fabric comprising: incorporating non-conductive textile filaments and energy-active functional filaments into a weaving apparatus; Integrating the non-conductive textile filaments and the energy-active functional filaments by weaving in accordance with a weave pattern, wherein at least one of the non-conductive textile filaments and the energy-active functional filaments is elastic; and stretching and recovering the fabric during use.

Another embodiment of the present invention is a method of modulating functionality of an electro-textile fabric comprising incorporating a higher concentration of floats of energy-active functional filaments in one surface of the electro-textile fabric than another surface of the electro-textile fabric.

Yet another embodiment of the present invention is a method of modulating functionality of an electro-textile fabric comprising incorporating floats of non-conductive textile filaments between floats of energy-active functional filaments.

B. Electro-Textile Antennas

Yet another embodiment of the present invention is an electro-textile antenna structure for interacting with high frequency electromagnetic radiation, and especially radiation in the frequency range of wireless communication. The electro-textile fabric antenna has an extremely high performance and embodies an aesthetic textile that is readily integrated into so-called wearables (such as, for example, garments or bands) or into any typical textile construction. Such an electro-textile antenna of woven fabric may comprise nonconductive fibers in a warp direction and conductive fibers in a weft direction. The antenna exhibits a high conductivity in the frequency range from DC (low frequency) to 100 GigaHertz (GHz) (high frequency).

Yet another embodiment of the present invention is an electro-textile antenna of woven fabric where the weft yarn, comprised of electrically-conductive fibers, further comprises metallic yarns of high electrical conductivity (e.g., that include, but are not limited to, copper, silver or silver plated copper), with a diameter of at least 40 micrometers.

Another embodiment of the present invention is a fabric antenna of woven fabric where the weft yarn, comprised of electrically-conductive fibers, further comprises metallized yarns (e.g., that include, but are not limited to, textile yarns of nylon or polyester having a copper or silver plating thereon) with a diameter of at least 40 micrometers. Yet another embodiment of the present invention is a fabric antenna of woven fabric where the weft yarn, comprised of electrically-conductive fibers, further comprises electrically-conductive fibers having a metallic coating thereon where the coating thickness is equal to or greater than the skin depth for the metal coating at an electrical frequency from DC (low frequency) to 100 GigaHertz (GHz) (high frequency).

Another embodiment of the present invention is a fabric antenna of woven fabric where the weft yarn, comprised of electrically-conductive fibers, comprises elastic electrically-conductive yarns that are elastified with spandex. Yet another embodiment of the present invention is a fabric antenna of woven fabric where both warp and weft yarns are elastic yarns.

Yet another embodiment of the present invention is a fabric antenna of woven fabric where the weft yarn, comprised of electrically-conductive fibers, further comprises elastic electrically-conductive yarns elastified with spandex exhibiting an electrical conductivity of at least $1 \times 10^6$ Siemens per meter in a range of 1000 MegaHertz (MHz) to 15 GigaHertz (GHz).

Another embodiment of the present invention is a fabric patch antenna of woven fabric further comprising a dielectric textile fabric comprised of fibers of at least one of polyester and fused quartz. Yet another embodiment of the present invention is a fabric patch antenna having an efficiency of at least 80% at a frequency of 2.4 GigaHertz (GHz).

Another embodiment of the present invention is a fabric patch antenna having at least one multi-mode resonant frequency.

Another embodiment of the present invention is a method for increasing conductivity of a fabric antenna of woven fabric by the steps of tensioning the warp yarn of the woven fabric during weaving on a weaving loom, and removing the woven fabric from the weaving loom and allowing the woven fabric to relax without tension. Yet another embodiment of the present invention is a method for increasing the conductivity of a fabric antenna of woven fabric by the further step of treating the woven fabric with a vapor, and applying heat to the woven fabric by at least one of heat setting and boiling water treatment, and thereafter allowing the treated woven fabric to relax without tension.

Another embodiment of the present invention is a method for changing the frequency response of a woven fabric antenna comprising non-electrically conductive fibers in a warp direction, and electrically conductive fibers in a weft direction. This method further comprises the step of at least one of stretching and recovering the woven fabric. Yet another embodiment of the present invention is a method for changing the frequency response of a woven fabric antenna comprising non-electrically conductive fibers in a warp direction, and elastic electrically conductive fibers in a weft direction, which further comprises at least one of stretching and recovering the woven fabric.

BRIEF DESCRIPTION OF THE DRAWINGS

The invention will be more fully understood from the following detailed description, taken in connection with the accompanying drawings, which form a part of this application and in which:

FIG. 6 is a graph of the return loss in decibels (dB) versus frequency in GigaHertz (Ghz) of a patch antenna of Example 22 according to the present invention;

FIG. 9 is a graph of the effective conductivity of the electro-textile fabric from the Q value measured via the microstrip resonator measurement method using the microstrip resonator measurement apparatus shown in FIG. 2;

FIG. 12 shows a double-covered yarn wrapped in the "S" direction with a first covering and in the "Z" direction with a second covering.

DETAILED DESCRIPTION

A. Electro-Textile Fabrics

Figure 1:
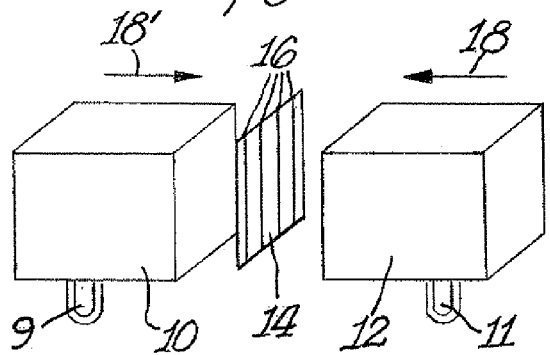
FIG. 1 is a schematic diagram of a waveguide cavity measurement apparatus.

In accordance with the present invention, it is possible to produce a seamlessly integrated electro-textile fabric containing energy-active functional filaments and non-conductive textile filaments using knitted or woven manufacturing processes. The present invention provides a highly efficient and low cost electro-textile fabric with a desired functionality, even though the electro-textile fabric is not wholly constructed with functional filaments and even though the functional filaments do not come in contact with each other. The components of this electro-textile fabric are discussed in the following sections.

I. The Energy-Active Functional Filaments

The energy-active functional filaments refer to filaments that have at least one functionality or exhibit at least one property upon interaction with an energy field, such as electrical/optical/magnetic field. Functionalities or properties associated with such members refer to the ability of these members to convert or to use one form of energy to control a response in another form of energy, that may include electrical, optical, magnetic, mechanical, chemical, or thermal energy forms.

Examples of such functional filaments include, but are not limited to, filaments that present: electrical function (e.g., electrical conductivity, heating, piezoelectric, electrostrictive, electrochromic activity); optical function (e.g., photonic crystal fibers, photoluminesce, luminescence, light transmission, reflection); magnetic function (e.g., magnetostrictive activity); thermoresponsive function (e.g., shape memory polymers or alloys); and sensorial function (e.g., chemical, bio, capacitive).

The energy-active functional filaments can comprise one or more filaments. The energy-active functional filaments can include, but are not limited to, filaments in the form of fibers, yarns, slit strips or ribbons. The filaments can be insulated or not insulated. These filaments can also be elastic energy-active functional filaments. Elasticity can be achieved according to the methods taught in patent applications: US 2004/0237594 A1, filed on Apr. 25, 2003, "Electrically Conductive Yarn, Methods for making the same, and Articles incorporating the same"; U.S. Provisional Application Ser. No. 60/627,168, filed on Nov. 25, 2004, "Elastic Composite Yarn, Methods for Making the Same, and Articles Incorporating the Same"; and U.S. Provisional Application Ser. No. 60/627,169, filed on Nov. 25, 2004, "Functional Elastic Composite Yarn, Methods for Making the Same, and Articles Incorporating the Same", all of which are incorporated by reference in their entirety.

II. The Non-Conductive Textile Filaments

The non-conductive textile filaments of the electro-textile of the present invention may be made from nonconducting inelastic synthetic polymer fiber(s) or from natural textile fibers that include, but are not limited to, cotton, wool, silk and linen. The synthetic polymer fibers may be continuous filament or staple yarns selected from multifilament flat yarns, partially oriented yarns, textured yarns, bicomponent yarns selected from nylon, polyester or filament yarn blends.

If the non-conductive textile yarn is Nylon, Nylon yarns comprised of synthetic polyamide component polymers, such as nylon 6, nylon 66, nylon 46, nylon 7, nylon 9, nylon 10, nylon 11, nylon 610, nylon 612, nylon 12 and mixtures and copolyamides thereof, are preferred. In the case of copolyamides, especially preferred are those including nylon 66 with up to 40 mole percent of a polyadipamide wherein the aliphatic diamine component is selected from the group of diamines available from E. I. Du Pont de Nemours and Company, Inc. (Wilmington, Del.) under the respective trademarks DYTEK A® and DYTEK EP®.

If the non-conductive textile yarn is polyester the preferred polyester is either polyethylene terephthalate (2GT, a.k.a. PET), polytrimethylene terephthalate (3GT, a.k.a. PTU) or polytetrabutylene terephthalate (4GT) In addition, the non-conductive textile filament can also be elastic, such as nylon covered Lycra® spandex yarns, or polyester covered Lycra® spandex yarns based on traditional yarn covering processes.

III. Floats

The electro-textile fabrics according to the present invention comprise "floats" of energy-active functional filaments within the non-conductive textile filaments as viewed from the surface of the textile.

"Floats" of filaments refer to the presence of a functional filament on the surface of the fabric over at least two intersections with other yarns comprising the fabric. In the context of the present invention, such floats generate an asymmetric fabric surface that presents regions with a higher concentration of the functional filaments, as compared to the non-conductive textile filaments, or vice versa. The floats can be concentrated across the whole fabric or only in a portion of the fabric.

Further, the present invention provides uses of the electro-textile fabrics where the location and concentration of the "floats" of the energy-active functional filaments provide unique attributes to the electro-textile. The electro-textiles of the present invention can find applications in areas where the functional activity is largely dependent on the substrate surface.

The location and concentration of the "floats" of the energy-active functional filaments provide unique attributes to the electro-textile fabric, and provide a textile with the capability to act as a substrate with highly efficient functionality. Functionalities that may benefit from the present invention include, but are not limited to, any functionalities that are dependent on surface area characteristics. Some examples of these functionalities include, but are not limited to:

1. Electromagnetic shielding;
2. Electro-textile antenna;
3. Capacitive switches;
4. Isolating electrical pathways in a fabric to provide more separation;
5. Increasing metal contact between skin and textile, as for achieving; textile electrodes for physiological sign monitoring (e.g., heart rate);
6. Maximizing light to the top surface in a fiber optic structure;
7. Using shape memory wire in a satin construction to achieve a curl or bend in the fabric rather than a uniform contraction via a plain weave;
8. Concentrating heat on one surface of a fabric in a resistive heating application;
9. Electromechanical actuation;
10. Transducers (e.g., light, energy); and
11. Functional molecule delivery (e.g., microcapsules, drug, etc.).

Note that the function of isolating electrical pathways of item 4 above can be accomplished by selectively removing filaments in at least one of a warp and weft direction. In addition, the selective removal of filaments in at least one of the warp and weft directions is an alternative way to form floats.

The relative amounts and exact choice of the functional and non-functional filaments to form the electro-textile fabric are selected according to the functionality desired and level of efficiency achieved. These factors also determine the number, density and concentration of the "floats" of the energy-active functional filaments.

By way of the present invention, it has been found that traditional textile knitting or weaving processes are suitable for moving or concentrating floats of functional elements into the electro-textile fabric of the present invention without the need for extra process steps. In most cases, there is no need for cross sections between the functional filaments, which can therefore be incorporated in a single direction (e.g., horizontal or vertical) in the electro-textile fabric.

A "float" can be "the portion of a warp or filling yarn that extends over two or more adjacent filling picks or warp ends in weaving for the purpose of forming certain designs" or "in a knit fabric, a portion of yarn that extends for some length without being knitted in." When using the textile knitting or weaving processes discussed herein, "floats" can be generated via certain weave patterns wherein filaments are floated across several yarns to bring them to a surface of the electro-textile fabric.

Figure 3A:
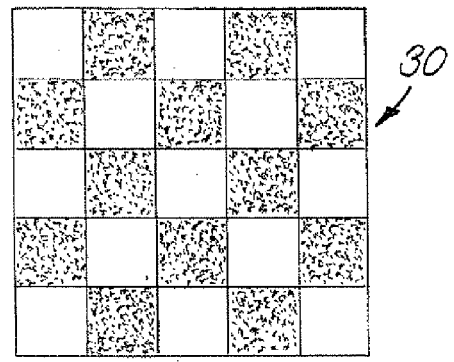
FIG. 3A shows the unit cell of a weave pattern diagram for a plain weave.
Figure 3B:
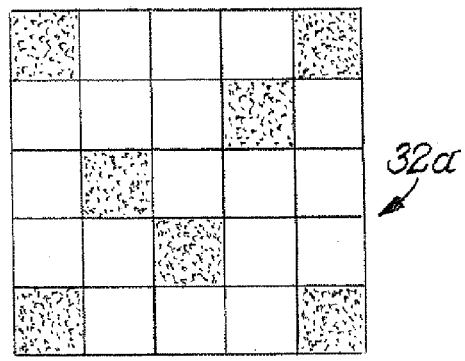
FIG. 3B shows the unit cell of the weave pattern diagram for Satin 4.
Figure 3D:
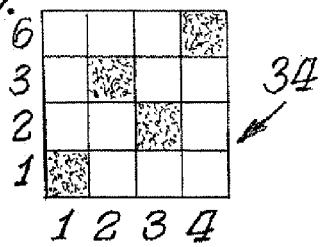
FIG. 3D shows the unit cell of yet another weave pattern diagram for Satin 4.
Figure 3C:
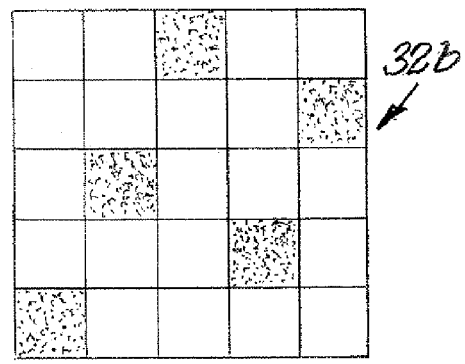
FIG. 3C shows the unit cell of the weave pattern diagram for another version of Satin 5.

FIGS. 3A to 3H are diagrams of the unit cells of weave constructions referenced in the Examples discussed below. FIG. 3A shows a plain weave pattern diagram 30. FIG. 3B and FIG. 3C show satin 5 weave pattern diagrams 32a, 32b. For the same surface area, a plain weave pattern diagram 30 has both faces showing a 1:1 ratio between the warp and weft yarns, while the satin 5 construction 32a, 32b has a 4:1 ratio. As shown in FIG. 3C, a satin 5 construction presents floats of weft yarns on one side of the fabric and floats of warp yarns on the other side of fabric. This provides the satin 5 weave construction with a higher concentration in the weft or warp yarns in one face of the fabric as compared to the other and therefore presents an asymmetry between the two fabric faces, as compared to the plain weave pattern, that shows a symmetry between the two faces of the fabric.

Figure 3E:
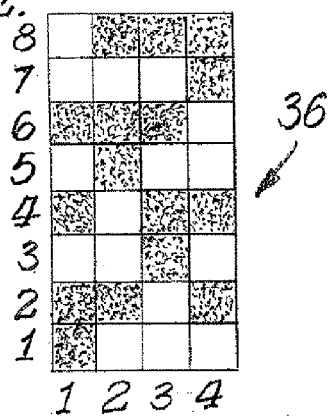
FIG. 3E shows the unit cell of the weave pattern diagram for double face Satin 4.
Figure 3F:
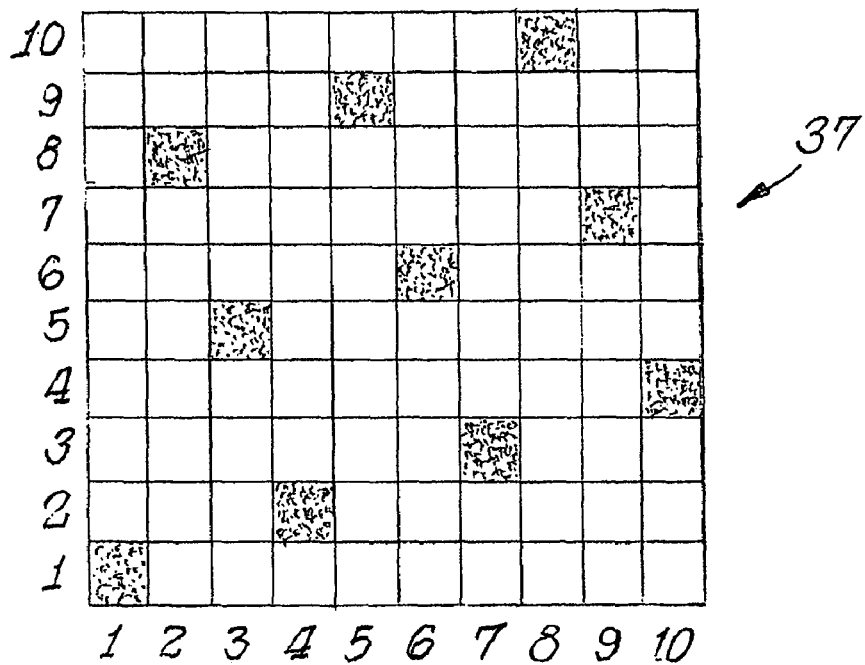
FIG. 3F shows the unit cell of the weave pattern diagram for Satin 10.

FIG. 3D shows a satin 4 weave pattern diagram 34. FIG. 3E shows a double face satin 4 weave pattern diagram 36. FIG. 3F shows a satin 10 weave pattern diagram 37. The Satin 4 weave pattern, similar to a Satin 5 weave, provides an asymmetric number of warp and weft yarn segments in each face of the fabric and therefore presents floats of weft yarns on one side of the fabric and floats of warp yarns on the other side of the fabric. A Satin 5 construction has longer floats, as compared to a Satin 4 construction, as a yarn and presents a float of 4 yarn segments in a Satin 5 weave as compared to a float of 3 yarn segments in a Satin 4 weave.

FIG. 3E shows double face satin 4 weave pattern diagram 36. In this weave pattern there is a symmetric number of the warp and weft yarns. However, the interlacing pattern is different from 1/1. Therefore, each face of the fabric presents floats of weft yarns and floats of warp yarns. The double face satin weave pattern shown in FIG. 3E further allows for the possibility to modulate the concentration of floats of energy-active functional filaments in only one surface of the fabric. As an example, this can be achieved by inserting the energy-active filaments as odd weft yarns, and non-conductive textile filaments as warp and even weft yarns in the weave pattern shown in FIG. 3E. In this case one face of the fabric presents floats of energy-active and non-conductive filaments, while the other face of the fabric presents floats of uniquely non-conductive filaments.

FIG. 3F shows a satin 10 weave pattern diagram 37. This is similar to the satin 5 or satin 4 weave patterns. However, it presents a higher order satin weave pattern. In a satin 10 weave, a yarn presents longer floats of 9 yarn segments compared to a Satin 5 weave which has floats of 4 yarn segments.

Figure 3G:
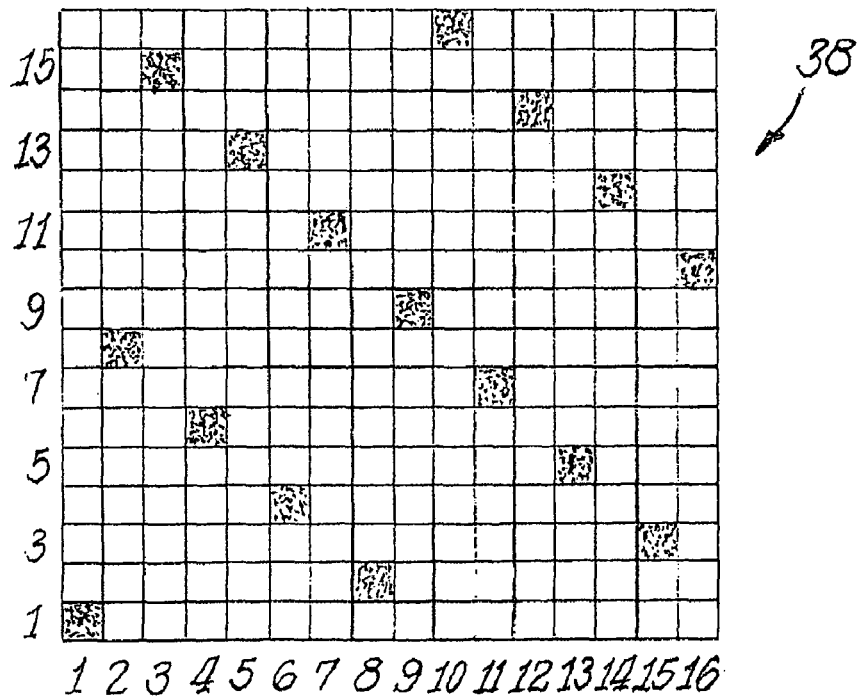
FIG. 3G shows the unit cell of the weave pattern diagram for Satin 16.

FIG. 3G shows a satin 16 weave pattern diagram 38. This is a still higher order satin pattern than Satin 10 weave, as it presents floats of 15 yarns segments compared to 9 in a Satin 10 weave pattern.

Figure 3H:
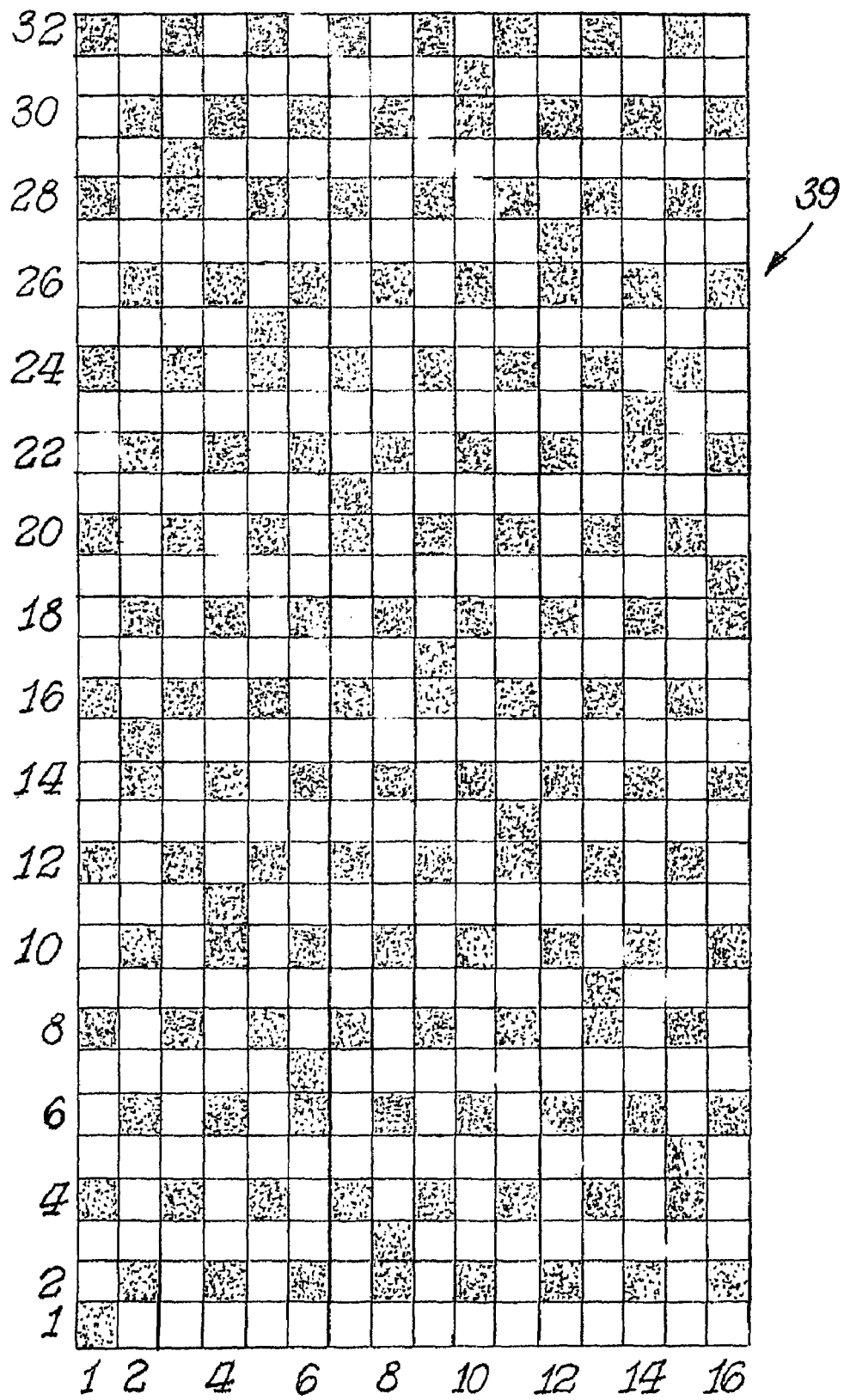
FIG. 3H shows the unit cell of the weave pattern diagram for another version of Satin 16 combined with plain weave.

FIG. 3H shows a satin 16 combined with a plain weave pattern diagram 39. In this Figure the odd weft yarns follow a Satin 16 weave construction, while the even weft yarns follow a plain weave pattern. This construction adds a higher number of warp yarn segments in the weft face of the weave compared to the Satin 16 weave pattern shown in FIG. 3G distributed in between the floats of the weft yarn segments. While this construction still presents floats of weft yarns on one face of the fabric and floats of warp yarns on the other face of the fabric, similar to the conventional satin weave patterns, the combination of a satin weave and a plain weave pattern creates separate long floats of weft yarns on one face of the fabric, while increasing the number of weft yarns and decreasing the length of the floats of warp yarns in the other side of the fabric.

Figure 3K:
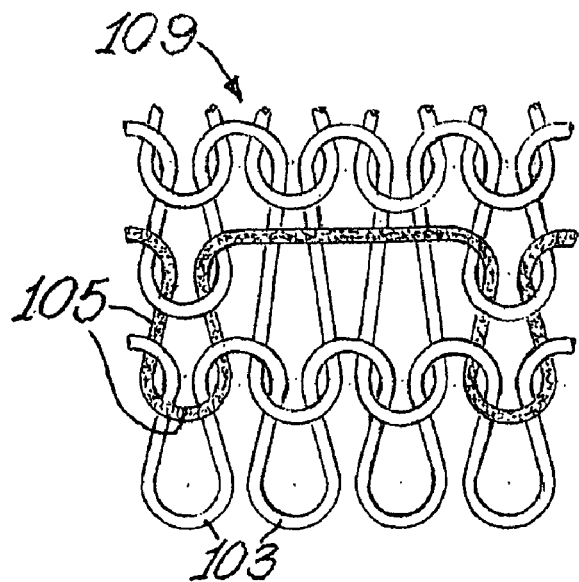
FIG. 3K is a schematic diagram of a knit electro-textile fabric in accordance with yet another embodiment of the present invention.
Figure 3I:
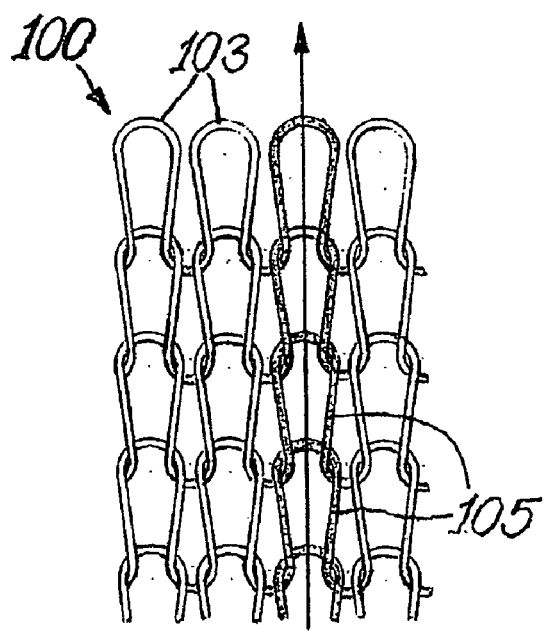
FIG. 3I is a schematic diagram of a knit electro-textile fabric in accordance with one embodiment of the present invention.
Figure 3J:
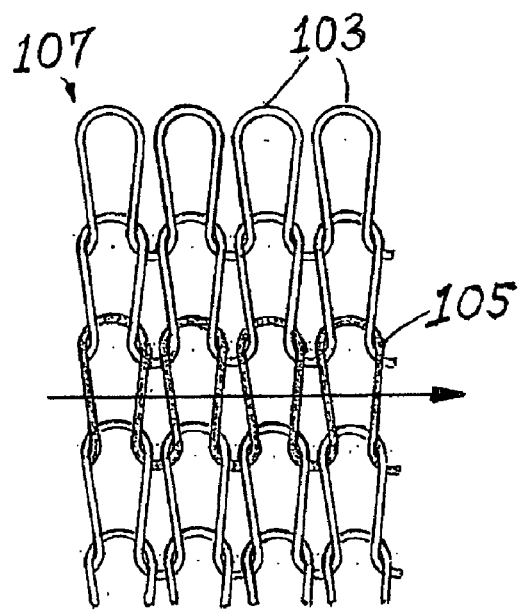
FIG. 3J is a schematic diagram of a knit electro-textile fabric in accordance with another embodiment of the present invention.

FIGS. 3I to 3K illustrate knitted electro-textile fabrics with non-conductive filaments and energy-active functional filaments. Floats are generated during knitting by carrying or dropping knit stitches according to desired patterns. In particular, floats result when energy-active filaments are floated across several knit stitches to bring them to a surface of the electro-textile fabric.

FIG. 3I shows one embodiment of a knitted electro-textile fabric 100 with non-conductive filaments 103 and energy-active functional filaments 105. In FIG. 3I, a series of stitches have segments that with energy-active filaments 105, such that the energy-active functional filaments 105 are oriented in the vertical direction. Alternatively, the energy-active filaments or segments 106 may be oriented in the horizontal direction or at angles relative to one another. Preferably, multiple energy-active filaments 105 are also oriented in parallel.

FIG. 3J shows another embodiment of a knitted electro-textile fabric 107 with non-conductive filaments 103 and an energy-active functional filament 105. The energy-active filament 105 shown in FIG. 3J forms a row of stitches oriented in the horizontal direction in the knit pattern. Alternatively, the energy-active filament 105 may be oriented in the vertical direction or by a series of filaments at angles relative to one another. Preferably, multiple energy-active filaments 105 are oriented in parallel.

FIG. 3K shows yet another embodiment of a knitted electro-textile fabric 109 with non-conductive filaments 103 and an energy-active filament 105. The energy-active filament 105 shown in FIG. 3K is knitted in a row of the knit construction with a float stitch across several non-conductive filaments 103 in order to bring the non-conductive filament 105 to a surface of the electro-textile fabric 109. Preferably, multiple energy-active filaments 105 are oriented in parallel are brought to the surface as floats. The multiple energy-active filaments 105 may be oriented in the vertical direction, horizontal direction and/or at angles relative to one another.

Figure 3L:
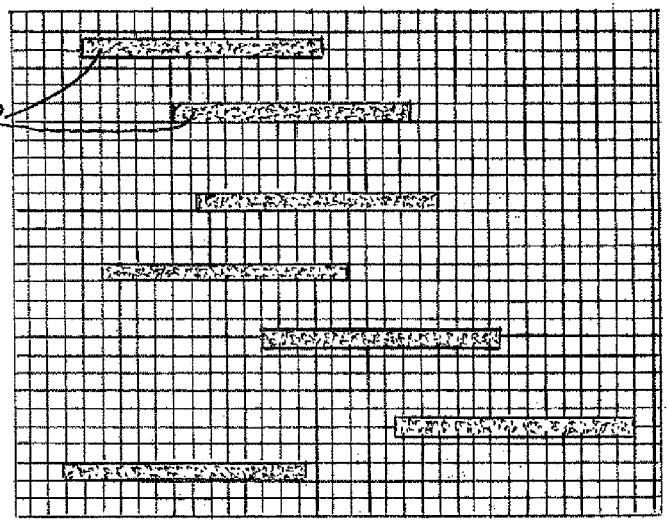
FIG. 3L is a schematic diagram of a knit electro-textile with floats distributed horizontally and in parallel in accordance with one embodiment of the present invention.
Figure 3M:
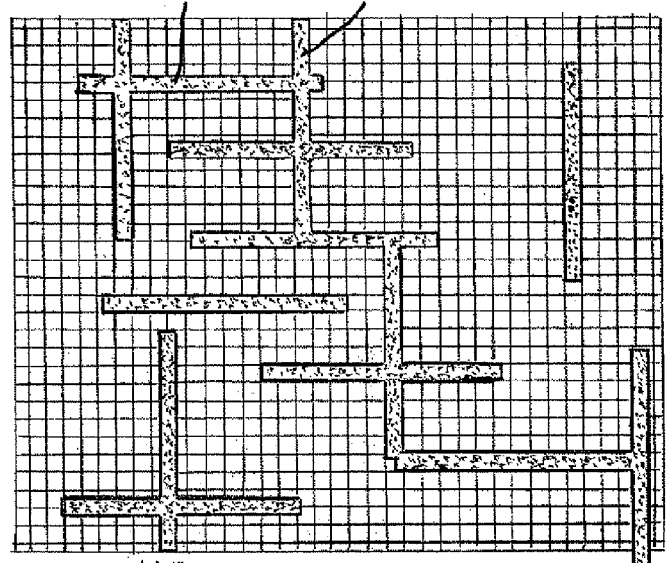
FIG. 3M is a schematic diagram of a knit electro-textile with floats distributed horizontally in parallel and vertically in parallel in accordance with another embodiment of the present invention.
Figure 3N:
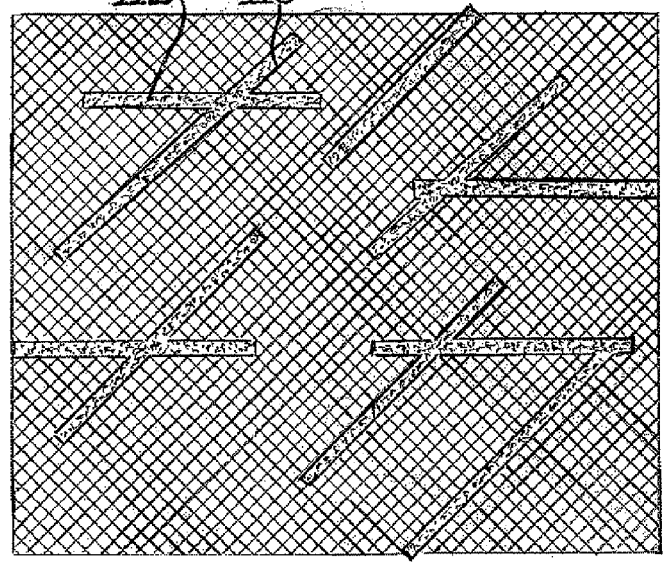
FIG. 3N is a schematic diagram of a knit electro-textile with floats distributed horizontally in parallel and diagonally in parallel in accordance with yet another embodiment of the present invention.

FIGS. 3L to 3N further illustrate how floats may be distributed and oriented in an electro-textile fabric. FIG. 3L shows floats of energy-active functional elements 112 that are distributed in parallel and oriented in horizontal directions. FIG. 3M shows floats of energy-active functional elements 112, 114 that are distributed in parallel and oriented in both horizontal and vertical directions. FIG. 3N shows floats of energy-active functional elements 112, 116 that are distributed in parallel and oriented in at least one of horizontal and vertical directions and at angles with respect to one another. The floats 116 are directed diagonally.

FIGS. 3O to 3V illustrate alternative woven electro-textile fabrics in accordance to the weave constructions referenced in FIGS. 3A to 3G, respectively. Therefore, the same comments supplied above for FIGS. 3A to 3G, apply to FIGS. 3O to 3V, respectively.

Figure 3O:
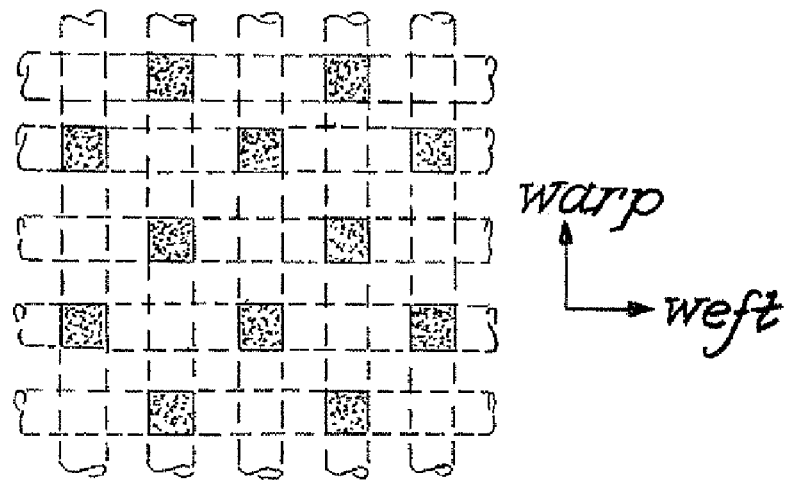
FIG. 3O schematically shows a woven electro-textile using the weave pattern diagram for a plain weave.
Figure 3P:
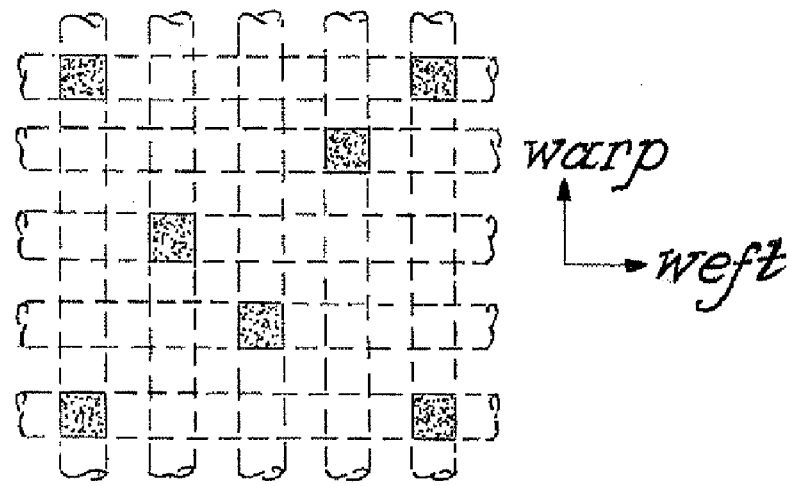
FIG. 3P schematically shows yet another woven electro-textile using the weave pattern diagram for Satin 4.
Figure 3Q:
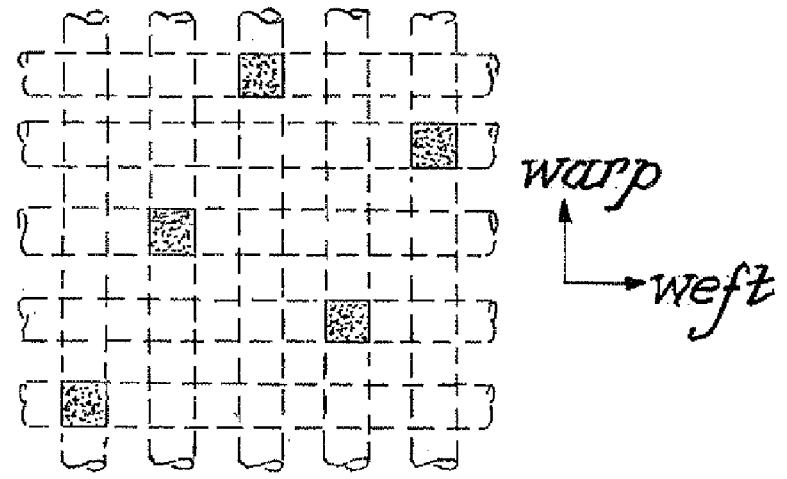
FIG. 3Q schematically shows a woven electro-textile using the weave pattern diagram for another version of Satin 5.

FIG. 3O shows a plain weave from weave pattern diagram 30. FIG. 3P and FIG. 3Q show different implementations of satin 5 weave pattern diagrams 32a, 32b. For the same surface area, a plain weave pattern diagram 30 has both faces showing a 1:1 ratio between the warp and weft yarns, while the satin 5 construction 32a, 32b have a 4:1 ratio.

Figure 3R:
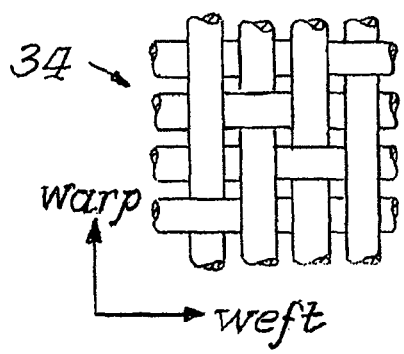
FIG. 3R schematically shows a woven electro-textile using the weave pattern diagram for Satin 4.
Figure 3S:
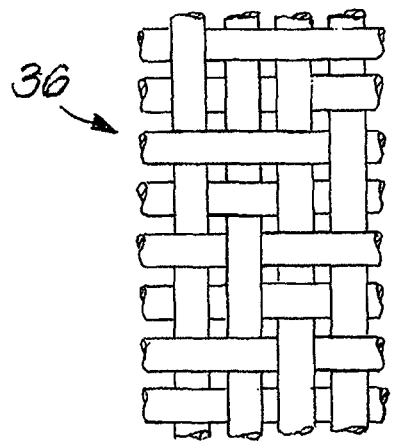
FIG. 3S schematically shows a woven electro-textile using the weave pattern diagram for double face Satin 4.
Figure 3T:
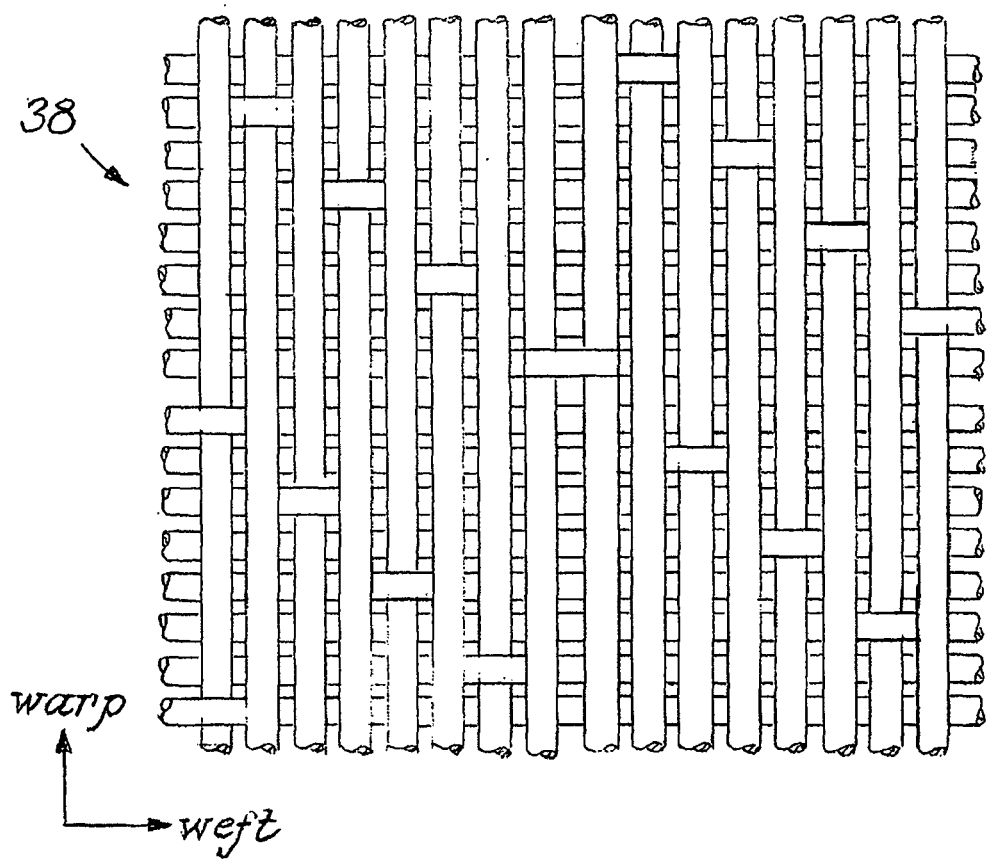
FIG. 3T schematically shows a woven textile using the weave pattern diagram for Satin 10.

FIG. 3R is a satin 4 weave formed from a weave pattern diagram 34 of FIG. 3D. FIG. 3S shows a double face satin 4 weave from a weave pattern diagram 36 of FIG. 3E. FIG. 3T shows a satin 10 weave formed from a weave pattern diagram 37 of FIG. 3F.

Figure 3U:
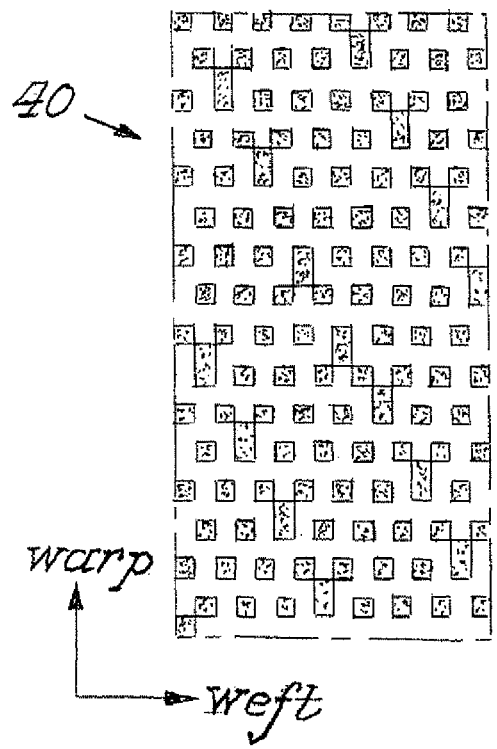
FIG. 3U schematically shows a woven electro-textile using the weave pattern diagram for Satin 16.
Figure 3V:
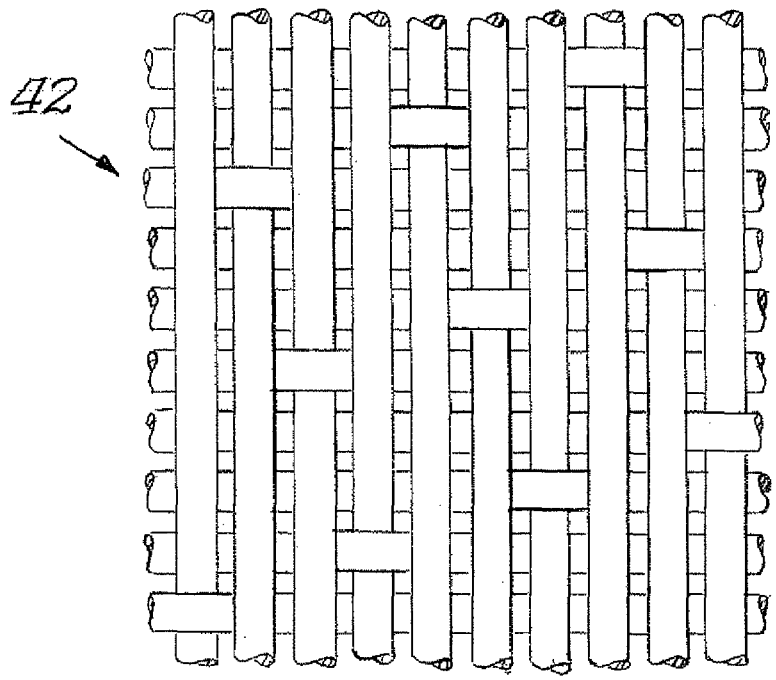
FIG. 3V schematically shows a woven electro-textile using the weave pattern diagram for another version of Satin 16 combined with a plain weave.

FIG. 3U shows a woven implementation of a satin 16 weave formed from a weave pattern diagram 38 of FIG. 3G. FIG. 3V shows a woven implementation of satin 16 weave formed from a weave pattern diagram 39 of FIG. 3H.

A desirable characteristic of these electro-textiles is the high surface functional activity. Depending on the requirements, it might be useful and advantageous to have a first surface that is highly functional while a second or opposite surface of the electro-textile fabric is considerably less functional on a single layer fabric. In other cases, it might be useful and advantageous to have both surfaces highly functional on a single layer fabric.

Such electro-textiles can be woven fabrics having the functional filaments in the weft direction and the non-conductive filaments in the warp direction. As an option, the order of interlacing of the fabric (i.e., weave pattern diagram) can be defined so as to provide a construction having an asymmetric number of warp and weft yarn segments on the surface of the fabric. Woven patterns suitable for use in this embodiment include, but are not limited to, satin constructions.

In accordance with one embodiment of the present invention, a first surface of the electro-textile fabric has "floats" of energy-active functional filaments. This embodiment provides a high functional activity on the first surface while a second or opposite surface of the fabric has "floats" of non-conductive textile filaments and provides a low functional activity.

In accordance with another embodiment of the present invention, the order of interlacing of the woven fabric (i.e., weave pattern diagram) can be defined so as to provide a construction having an asymmetric number of warp yarn segments and weft yarn segments on both surfaces of the fabric. However, in this embodiment, both surfaces of the woven fabric have "floats" of energy-active functional filaments. Weave patterns suitable for use in this embodiment include, but are not limited to, double-face satin constructions. Preferably satin 4 double face.

In accordance with yet another embodiment of the present invention, the order of interlacing of the woven fabric (i.e., weave pattern diagram) is defined so as to provide a construction having an asymmetric interlacing pattern in the warp yarn direction or weft yarn direction. In this case the number of warp yarn segments and weft yarn segments on the surface of the fabric can be at least equal (i.e., 1/1). However, the interlacing pattern is different than 1/1. Weave patterns suitable for use in this embodiment include, but are not limited to, warp rib, filling rib, basket weave and twill constructions.

According to a method for constructing this embodiment, both surfaces of the fabric have "floats" of energy-active functional filaments and "floats" of non-conductive textile filaments.

Further, the present invention provides electro-textiles with elastic recovery properties and methods for producing such electro-textiles. In cases where the functional filaments, the non-functional filaments, or both, are elastic, the electro-textile fabric of the present invention is furthermore rendered elastic with stretch and recovery characteristics. Apart from the advantage that this has to the conformability of such textile, the elastic property becomes uniquely advantageous here in that it can act as a mechanism to control or vary the concentration of functional regions within the textile fabric. In a typical weaving process the textile is formed while in a tensioned state. The fabric relaxes after it is removed from the weaving loom.

Such electro-textile fabrics can be woven fabrics having the functional filaments in the weft direction and the non-conductive filaments in the warp direction. If the warp fibers are elastic, upon removing the fabric from the weaving loom, the functional filaments will tend to gather closer together. Such gathering of functional filaments increases the nominal functional filament density. This has the additional consequences of increasing the concentration and thus increasing the functional activity of such textiles.

In the alternative case where the weft fibers are elastic, upon removing the fabric from the weaving loom, the non-conducting filaments will tend to gather closer and the nominal non-conducting filament density increases. In addition, the functional activity may be modulated by stretching and recovering the fabric during use (e.g., in wearable or garment applications) or during integration of the textile in a fabric.

The techniques of the present invention also provide a high efficiency electro-textile fabric antenna and methods for making such antenna. The novel electro-textile fabric antenna embodies an aesthetic textile that is readily integrated into so-called wearables (such as but not limited to garments) or into any textile construction.

Additional embodiments and methods of the present invention are further described for an electro-textile antenna structure that displays a high efficiency at high frequencies, and especially in the frequency range of wireless communication.

In the present invention, it has now been found that the conductivity of a textile, as characterized in direct current (DC) range, may be significantly different in alternating current (AC) applications. As the frequency increases, the conductivity behavior of the electrically conductive fibers changes and alters the performance of the electro-textile. An electro-textile may be a perfect conductor in the DC or low frequency range, but the same textile may be a poor conductor in the RF or microwave range.

In the present invention it is not necessary to have a metallic coating on the surface of the textile. Nor is it necessary that the electro-conductive fibers cross each other within the textile fabric to have high conductivity efficiency in the frequency range.

Appropriate design of the electro-textile fabric, as disclosed herein, shows that when the electrically conductive fibers are introduced in only one direction of the textile, a significant efficiency, as high as compared to a reference copper plate type of material, may result. Further, a fabric antenna that is flexible, comfortable and conformable may be formed with the electro-textile of the present invention. Such antenna shows a signal strength, pattern and efficiency similar to standard rigid antennas used in telecommunication devices at frequencies as high as 100 GigaHertz (GHz).

Another embodiment of the present invention is an electro-textile antenna of woven fabric comprising nonconductive fibers in a warp direction; conductive fibers in a weft direction; and exhibiting a high conductivity in the frequency range from DC (low frequency) to 100 GigaHertz (GHz) (high frequency). The woven fabric antenna is provided with at least a first fabric face having a higher concentration of electrically conductive yarn segments as compared to a second or opposite fabric face. Woven constructions suitable for use in this embodiment include those that have an asymmetric pattern of warp and weft yarn segments, including, but not limited to, satin construction, double face, twill construction and satin constructions of higher order than satin 5.

Suitable woven constructions for the woven fabric antenna are provided where a ratio of the number of weft yarn density to the number of total yarn density (weft+warp) is at least 30%. Suitable woven constructions for the woven fabric antenna are also provided where the warp fibers are elastic yarns. Elastic fibers of yarns elastified with spandex (especially Lycra®) fiber including, but not limited to, a companion fiber having good dielectric properties are preferred. When selecting the companion fiber having good dielectric properties, with respect to dielectric loss, we have found that polyester or fiberglass is preferred over cotton or nylon.

Yet another embodiment of the present invention is an electro-textile antenna of woven fabric where the weft yarn, comprised of electrically-conductive fibers, further comprises metallic yarns of high electrical conductivity (e.g., that include, but are not limited to, copper, silver or silver plated copper), with a diameter of at least 40 micrometers.

Another embodiment of the present invention is a fabric antenna of woven fabric where the weft yarn, comprised of electrically-conductive fibers, further comprises metallized yarns (e.g., that include, but are not limited to, textile yarns of nylon or polyester having a copper or silver plating thereon) with a diameter of at least 40 micrometers. Yet another embodiment of the present invention is a fabric antenna of woven fabric where the weft yarn, comprised of electrically-conductive fibers, further comprises electrically-conductive fibers having a metallic coating thereon where the coating thickness is equal to or greater than the skin depth for the metal coating at an electrical frequency from DC (low frequency) to 100 GigaHertz (GHz) (high frequency).

Skin depth is defined as: $\delta = 1/\sqrt{\pi f \mu \sigma}$, in meters, where f=frequency, $\mu$=magnetic permeability, in H/m and $\sigma$=electrical conductivity, in $\Omega^{-1}$ m$^{-1}$. Skin depth depends on the frequency as well as the material. For example, for copper, the skin depth at 50 Hz is 9.3 mm, at 150 KHz is 0.17 mm, at 30 MHz is 12 µm, and at 1 GHz is 2.1 µm. At the same frequency range, the skin depth for steel is: at 50 Hz 1.0 mm, at 150 KHz 0.22 mm, at 30 MHz 41 µm and at 1 GHz 7.1 µm. At high frequencies (i.e., higher than 30 MHz) therefore, the skin depth becomes significantly small especially compared to the real dimensions of the material.

Skin depth becomes relevant in AC applications, and becomes very significant in RF applications. As frequency increases, the skin depth decreases dramatically. In fact, skin depth is the distance required to attenuate the field by 1/e (~37%). Therefore, it is generally accepted that three (3) skin depths are required so that 100% attenuation is achieved.

Another important consideration in high frequency applications is the definition of the material resistance. The material resistance is in general defined as: $R = L/(\sigma A)$, where L is the length, $\sigma$ is the electrical conductivity, and A is the cross-sectional area. In the DC or low frequency range, A is the real cross-section area of the material. In the AC or high frequency range, A is the effective area defined as A=δP, where δ is the skin depth at the frequency in use, and P is the perimeter of the material cross-section.

Test Methods

The characterization of the conductivity of electro-textiles at high frequencies is based upon the methods known for the characterization of metal conductivity. The following two methods were developed for characterizing electro-textiles at high frequencies:

I. Waveguide Cavity Measurement

A high-Q waveguide cavity method was set-up in order to characterize all the energy loss mechanisms from the materials, which include heat loss in the electro-textile as well as energy leakage through the electro-textile. Microwave resonator circuits are characterized by a quality factor (Q), which defines the amount of energy stored in versus the amount of energy lost to the cavity. As shown schematically in FIG. 1, one rectangular metal waveguide cavity (15.8 mm×7.9 mm×47 mm) is split into two half cavities 10, 12. In order to excite the resonator, energy is coupled into the resonator via coupling probes in the coax feeds of input port 9 and/or output port 11 of the half cavities as shown in an exploded view in FIG. 1. Wave propagation through the waveguide cavity follows the Transverse Electric Mode (TE) according to which the electric field is perpendicular (i.e., transverse) to the direction of wave travel, as indicated by the arrows 18, 18' in FIG. 1.

To take into account the effects of input/output loading, the quality factor of the microwave cavity is fully described by three different factors: the loaded Q ($Q_L$), the unloaded Q ($Q_u$) and the external Q ($Q_{ext}$). During a measurement, only $Q_L$ can be measured, while $Q_u$ and $Q_{ext}$ are evaluated after extrapolation. Such extrapolation requires the measurement of the scattering matrix (S), that defines the relation between input wave A at first input port 9 and output wave B at second output port 11 according to: B=SA, that contains information about the wave amplitude and phase, and therefore describes the behavior of the system. The parameters, Sij, are the components of the scattering matrix (S) and indicate the characteristics of the output wave on first port 9 due to the input wave on second port 11. For a 2-port waveguide system, as in the method followed here, the S matrix is comprised of 4 parameters, $S_{11}$, $S_{12}$, $S_{21}$ and $S_{22}$.

In the measurement procedure both halves 10, 12 are first used to calibrate the system by weakly coupling to both half metal cavities 10, 12 and aligning them together to form one metal waveguide cavity. Second, a resonance is used in a half metal cavity to characterize the electro-textile. In this step, the coupling of the second half metal cavity is changed to critical coupling and the test material 14 such as a sample of an electro-textile, is inserted between the two half cavities 10, 12 so as to cover the entire aperture of the waveguide cavity. This is used to calculate the unloaded Q ($Q_u$) of the waveguide resonator. From the $Q_u$ of a half metal cavity 10, 12 the conductive loss in the electro-textile 14 and therefore the effective surface resistance and conductivity of the test electro-textile 14 can be calculated.

The electro-textile test material 14 is shown with conductive fibers 16 extending in parallel to each other, and vertically in parallel to the electric field and transverse to the direction of wave propagation. The spacing between the conductive fibers is selected to simulate the spacing of the fibers when integrated in a woven fabric.

II. Microstrip Resonator Measurement

The waveguide cavity method described above may be used to test textiles comprising of 100% of conductive fibers. However, this method may not be suitable for textiles comprised of both conductive and non-conductive fibers, as in the present invention. This is because the non-conductive fibers inhibit a good electrical connection between the electro-textile and the waveguide aperture. To address these issues, a microstrip resonator measurement set-up was established as shown in FIG. 2.

The microstrip resonator 20 with a width of 4.12 mm, length of 34.85 mm and resonance frequency at 2.6 Giga-Hertz (GHz), was fabricated on a substrate 25 of Rogers DUROID® RO3003 dielectric material (Rogers Corporation Microwave Materials Division) that has a thickness of 60 mil, $\in_r$=3 and tan δ=0.0013. The microstrip resonator 20 is fed by a non-contacting method, as shown in FIG. 2, according to which the coupling is the result of magnetic and electric field coupling from the feed lines 22, 24. The width of the feed lines 22, 24 is 4.12 mm, the same as the microstrip resonator 20, which is the width of 50Ω line on the substrate. A laminated copper layer 28 is used on the backside of the substrate 25 as the ground plane of the microstrip resonator 20. In this measurement method, a piece of electro-textile material is placed on the top of the substrate 25 (not shown in FIG. 2) and the loaded Q ($Q_L$) and $S_{21}$ of the resonator is measured. From those measurements the unloaded Q ($Q_u$) of the electro-textile resonator can then be evaluated. This method is suitable for the characterization of the conductivity of any electro-textile material.

Figure 2:
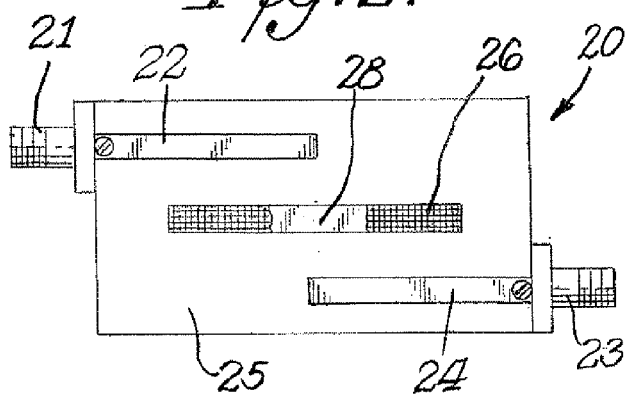
FIG. 2 is a schematic representation of a microstrip resonator measurement apparatus.

A reference resonator, similar to that shown in FIG. 2, was created based on a piece of a copper foil placed on the top of the substrate to account for variations in the set-up and numerical simulation to extract the effective conductivity of the electro-textile. FIG. 9 presents the effective conductivity of the fabric (in Siemens/m), as calculated by numerical simulation based on the measured $Q_u$ value. The simulation was made using the Momentum simulation software in Agilent Advanced Design System that was designed by Agilent Technologies.

The microstrip resonator measurement method, as performed in the Examples below, provides an evaluation of Q. FIG. 9 is then used to extract the value of the electro-textile conductivity. The copper foil is the reference material, and is the upper limit of conductivity sought. The closer the value of conductivity of the electro-textile to the conductivity value of the copper foil, the better will be the conductive properties of the electro-textile. Q is dependent on the measurement method and therefore usually is not of interest when comparing between different test methods. The simulation in FIG. 9 is believed to be valid for every sample measured according to the microstrip resonator measurement method described herein.

EXAMPLES

Comparative Example 1

A woven fabric (GVA-C-1) was made based on a plain weave construction. The fabric has as warp yarn, a cotton Ne 100/2 yarn and, as weft yarn, a silver-plated copper wire of 40 μm diameter obtained from ELEKTRO-FEINDRAHT AG, Switzerland. The yarn density measured for this fabric while the fabric was still on the loom was: warp 152 ends/in and weft 102 picks/in. The Qu value of this fabric measured via the microstrip resonator measurement was 14.4 from one side of the fabric and 14.4 from the other side of the fabric. This value is extremely low, which indicates a very low electrical conductivity for the fabric.

Example 1

A woven fabric (GVA-C-20) was made based on a plain weave construction. The fabric has as warp yarn a Cordura®/Lycra® elastic yarn and as weft yarn a silver-plated copper wire of 40 μm diameter, similar to the weft yarn of Comparative Example 1. The yarn density measured for this fabric was: warp 152 ends/in and weft 76 picks/in. The $Q_u$ value of this fabric measured via the microstrip resonator measurement was 84.5 from one side of the fabric and 84.1 from the other side of the fabric.

This fabric, according to the present invention, displays a surprisingly high conductivity compared to the fabric of Comparative Example 1, despite the fact that the weft yarn density of this Example is lower than that of Comparative Example 1. The main difference that remains to consider between the two Examples is in the warp yarn. The warp yarn used in Example 1 is an elastic yarn and, depending on the tension of the yarn chosen during weaving operation, the fabric may shrink in the warp direction when removed from the machine and allowed to relax. This will then lead to a higher actual weft yarn density in the fabric. It was calculated that the actual weft yarn density in Example 1 after fabric removal from the loom was 117 picks per inch (ppi) compared to 76 ppi when the fabric was on the loom.

Example 1 demonstrates that it is now possible to control the spacing between the electrically conductive fibers, a critical parameter in the fabric design, not by the weaving process but by introduction of warp elastic yarns. This can be very useful as there are limits introduced by the weaving loom as to the max yarn density that can be introduced during the weaving process. It is surprising that, for the purposes of controlling the fabric conductivity efficiency, this change in yarn density due to stretch is significantly high to cause a significant increase in conductivity.

Example 2

A woven fabric (GVA-C-17) was made based on the same warp and weft yarns and the same warp and weft yarn density as the fabric of Example 1, but differs from the fabric of Example 1 in the weaving construction. This fabric had a satin 5 construction. The $Q_u$ value of this fabric measured via the microstrip resonator measurement was 69.3 from one side of the fabric and 108.2 from the other side of the fabric.

First, we observe that this fabric shows a surprising conductivity performance compared to all other fabrics displayed in the Comparative Examples and in Example 1 above. That is, the fabric of Example 2 shows an asymmetrical behavior in conductivity between the two faces of the fabric. In contrast, Example 1 showed a similar value for the conductivity within the experimental error for both faces of the fabric. In Example 1 and Comparative Example 1, the fabrics had a plain weave construction while in Example 2, the fabric has a satin weave construction. This difference demonstrates that it is now possible to: (i) modulate the conductivity within the same textile construction; and (ii) increase the conductivity through the fabric construction, rather than through the space or size of the conductive yarns.

By comparing the Q value between Example 1 and Example 2, it is observed that one side of the fabric has significantly higher conductivity, while the other side of the fabric has lower conductivity than the value measured on the fabric of Example 2. Schematics of a plain weave 30 and of a satin 5 construction 32b are shown in FIG. 3A and FIG. 3C, respectively. As discussed above, for the same surface area, a plain weave construction 30 has both faces showing a 1:1 ratio between the warp and weft yarns, while a satin 5 construction 32b would show a 4:1 ratio. For the conductive yarn-rich face this could explain the observed big difference in Q value.

However, it is surprising that the warp-rich fabric that has less metallic content on the fabric side shows such a high Q value, especially when compared to Comparative Example 1. As the warp yarn used for this fabric of Example 2 is elastic, we measured the actual weft yarn density on the fabric after the fabric is removed from the loom. This has a value of 173 ppi, which is significantly higher than the weft yarn density of 76 ppi and is also significantly higher than the actual weft yarn density of 117 measured on the fabric of Example 1.

Example 2 shows that by applying a satin 5 construction (32a, 32b in FIG. 3B, FIG. 3C), the fabric has the potential of achieving a significantly higher conductivity compared to a plain weave construction (30 in FIG. 3A) when all other parameters are kept constant.

Example 3

A woven fabric (GVA-C-5) was made as in Example 2 with the only difference that the weft yarn density of this fabric was 147 ppi. This value is almost twice as the weft yarn density of the fabric of Example 2. The Q value of the side of the fabric having a higher concentration of the warp yarns, measured via the microstrip resonator measurement method, was 81.2. The Q value measured from the side of the fabric with the higher concentration of the weft yarns based on the same method was 114.9.

As in Example 2, which was also based on the same fabric construction, this value is significantly higher than the value of the opposite side of the same fabric. This indicates that the conductivity of the fabric can be increased significantly by the content of metal on the fabric side via weave construction. The higher the Q, the higher is the effective conductivity of the material and the better the efficiency of the material for high frequency applications, such as EMI shielding or antenna applications.

Comparison between Examples 2 and 3 indicates a significantly higher Q for Example 3 for both sides of the fabric. As the only difference between the two fabrics is in the weft yarn density, it is observed that increasing the conductive yarn density or decreasing the space between the conductive yarns can further enhance the conductivity of the fabric. It was calculated that the actual weft yarn density in Example 3, after fabric removal from the loom, was 201 ppi compared to 147 ppi when the fabric was on the loom.

Example 4

Table 1 below shows seven woven fabric samples of Satin 5 weave construction similar to the woven fabric of Example 2. These samples differ from Example 2 in the weft yarn density. Table 3 1 includes the fabrics discussed in Examples 2 and 3 and further includes more fabrics. In these samples, the weft yarn density was varied from 46 ppi to 157 ppi. It is observed that the conductivity of the fabric increases with increasing weft yarn density.

Figure 10:
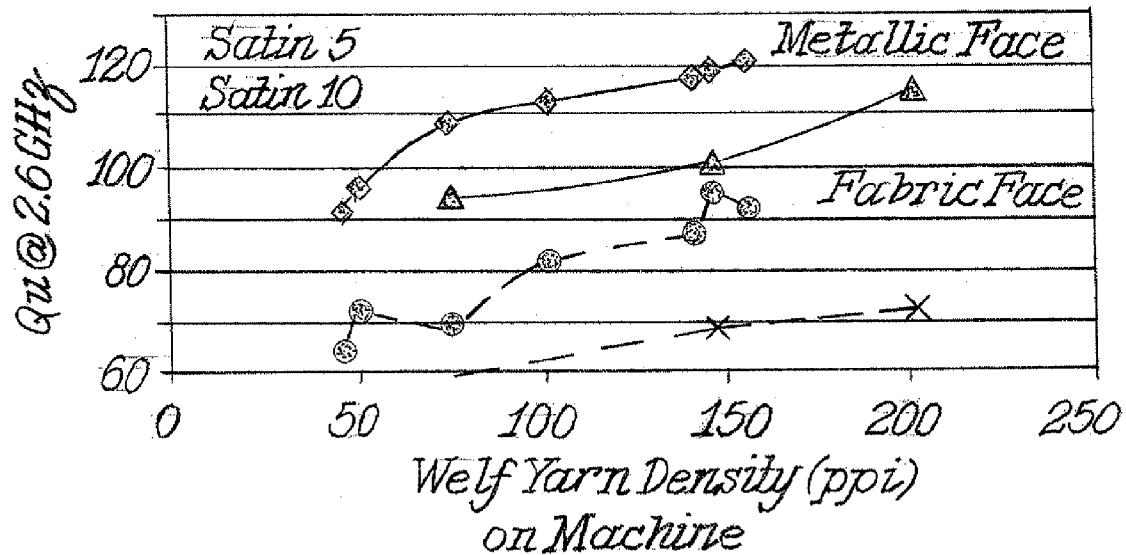
FIG. 10 is a graph of the Qu at 2.6 GHz versus Weft Yarn Density in ppi measured on the machine (i.e., a loom) for Satin 5 and Satin 10 weave constructions.

The behavior of the change of the conductivity with weft yarn density is similar for the metallic and the fabric faces, as shown in (FIG. 10). FIG. 10 is a graph of Qu versus Weft Yarn Density, as measured on a machine (i.e., a loom) comparing various Satin 5 weave constructions for both faces of the fabric. The Satin 5 weave construction shows a continuous asymmetric behavior in conductivity between the two faces of the textile that does not depend on the conductive yarn density.

Figure 11:
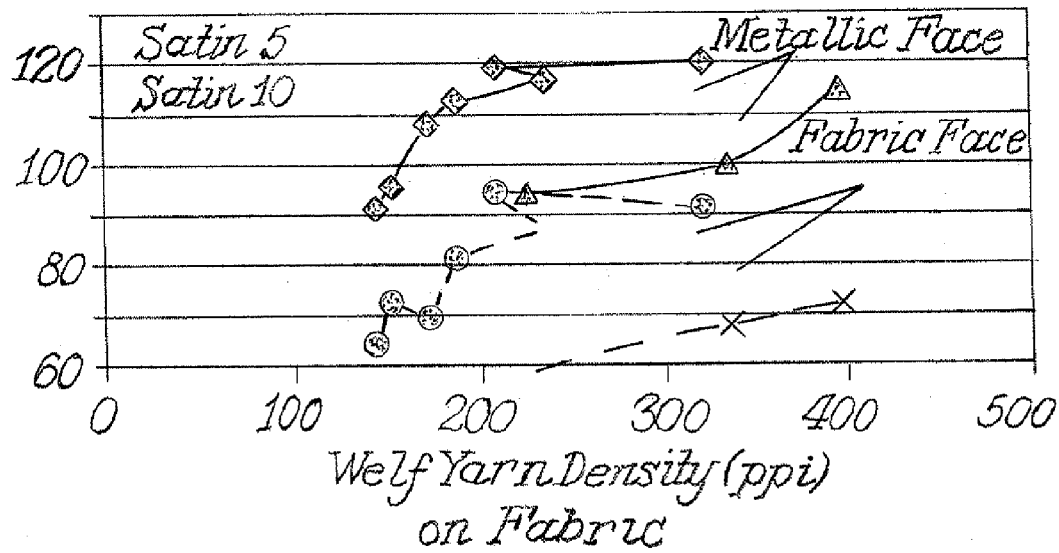
FIG. 11 is a graph of the Qu at 2.6 GHz versus Weft Yarn Density in ppi measured after the fabric is removed from the loom for Satin 5 and Satin 10 weave constructions.

FIG. 11 shows the plot of $Q_u$ versus the actual Weft Yarn Density measured on the fabric after the fabric was removed from the loom for the same weave constructions as applicable in FIG. 10. There is a steep increase in conductivity for weft yarn density up to about 210 ppi. After that, the conductivity reaches a plateau value. The graph of FIG. 11 shows that for a conductive yarn comprising of a silver-plated copper wire having a diameter of 40 μm, optimum conductivity is achieved for a conductive yarn density of about 210 ppi, under a ratio of (conductive yarn density)/(non-conductive yarn density) of 4:1.

struction (36 in FIG. 3E). By this construction, one face of the fabric was made based on conductive yarns as the weft yarn, while the other face was made based on the same warp and weft yarns. The $Q_u$ value from one face of the fabric was measured to be 72.6, and from the other face of the fabric that had higher conductive yarn concentration as 98.0. Both of these are significantly lower than the $Q_u$ values of Example 3, although the actual yarn density measured on this fabric was 218 ppi, a higher value than that of 201 ppi measured on Example 3.

It was surprising that considering that one face of the fabric was made based on non-conductive yarns, the Q value measured was sufficiently high to show a good conductive behavior. This Example 6 demonstrates the construction of the

TABLE 1

Example 4: Satin 5 construction: Effect of Weft Yarn Density.

| | | Yarns | | Yarn Density on Machine | | Yarn Density on Fabric | | Qu @2.6 GigaHertz (GHz) Microstrip Method | |
|---|---|---|---|---|---|---|---|---|---|
| Sample ID # | Weave | Warp Yarn | Weft Yarn | Warp (ends/in) | Weft (picks/in) | Warp (ends/in) | Weft (picks/in) | Metal Side | Fabric Side |
| GVA-C-21 | Satin 5 | Cordura/Lycra ® | Ag—Cu 40 um TW-0 | 152 | 46 | 152 | 145 | 85.1-97.3 | 55.0-73 |
| GVA-C-22 | Satin 5 | Cordura/Lycra ® | Ag—Cu 40 um TW-0 | 152 | 51 | 152 | 154 | 91.9-100.3 | 66-78.7 |
| GVA-C-17 | Satin 5 | Cordura/Lycra ® | Ag—Cu 40 um TW-0 | 152 | 76 | 152 | 173 | 108.2 | 69.3 |
| GVA-C-18 | Satin 5 | Cordura/Lycra ® | Ag—Cu 40 um TW-0 | 152 | 102 | 152 | 188 | 112.3 | 81.5 |
| GVA-C-16 | Satin 5 | Cordura/Lycra ® | Ag—Cu 40 um TW-0 | 152 | 142 | 152 | 237? | 117.0 | 86.7 |
| GVA-C-14 | Satin 5 | Cordura/Lycra ® | Ag—Cu 40 um TW-0 | 152 | 147 | 152 | 210 | 118.6 | 94.6 |
| GVA-C-15 | Satin 5 | Cordura/Lycra ® | Ag—Cu 40 um TW-0 | 152 | 157 | 152 | 323 | 120.6 | 91.4 |

Example 5

A woven fabric (GVA-C-2) was made similar to that of Example 3 with the only difference being in the warp yarn. This fabric had a rigid warp yarn based on Cotton Ne 100/2 compared to the warp yarn of Example 3, which was elastic. The $Q_u$ value of this fabric measured via the microstrip resonator measurement was 76.2 from the warp yarn rich side of the fabric and 92.3 from the other side of the fabric. Comparing the $Q_u$ value between this Example 5 and Example 3, any side of the fabric of Example 3 is significantly higher than the value measured on the fabric of this Example 5. As this fabric has no elasticity, its actual weft yarn density is similar to the value defined on the machine. In fact, comparison of these results, in view of FIG. 11, shows that the $Q_u$ value of this fabric is within the range that would be expected for this weft yarn density. Any differences will only be attributed to the nature of the warp yarn and the dielectric loss that this may affect.

Example 6

A woven fabric was made (GVA-C-4) as in Example 3, except that the weave pattern was a double face satin 4 confabric is of utmost importance in controlling the conductivity behavior beyond the conductive yarn type, size and spacing variables.

Example 7

A woven fabric was made (GVA-C-13) as in Example 6 with the difference being that both faces of the double face satin 4 construction (36 in FIG. 3E) are the same and contain the metallic face. This fabric shows a high conductivity value similar to the Example 6 metallic face, but with the difference that the conductivity of this fabric is symmetric for both fabric sides. This indicates the possibility of achieving a high symmetric conductivity via a double face construction. This can have potential use in applications where there is required high metallic content in both faces of the fabric, for example for soldering and ground shielding applications.

Example 8

A woven fabric was made (GVA-C-12), as in Example 3, with the difference being that this fabric has a satin 10 construction. The Qu value of the metallic face of the fabric was 100.5, while $Q_u$ of the fabric face was 68.1. The conductivity of both faces of the fabric is significantly lower compared to the fabric of Example 3, although this Example 8 has a higher actual weft yarn density. The lower conductivity measured for the metallic face of the fabric is surprising considering the higher metal concentration for that face of the fabric in a Satin 10 compared to a Satin 5 construction.

Example 9

Table 2 shows three woven fabric samples similar to the woven fabric of Example 8 that differ in the weft yarn density. This table includes the fabric discussed in Example 8 and further includes more fabrics. In these samples, the weft yarn density, as defined on the machine, was varied from 76 ppi to 203 ppi. The conductivity of the fabric increases with increasing weft yarn density. The behavior of the change of the conductivity with weft yarn density is similar for the metallic and the fabric faces, as shown in FIG. 10, which provides a continuous asymmetric behavior in conductivity which is independent of the conductive yarn density.

FIG. 11 shows the plot of QU versus the actual weft yarn density measured on the fabric after the fabric was removed from the loom. A comparison of the change in conductivity with weft yarn density between a Satin 10 versus a Satin 5 weave construction, as displayed in FIGS. 10 and 11, shows that: the asymmetry in conductivity is higher in the Satin 10 construction as expected.

However, it is very surprising that the Satin 10 construction shows a lower conductivity for any face of the fabric compared to a Satin 5. It is also surprising that in the Satin 10 construction the conductivity of the fabric continues to increase at an actual weft yarn density of higher than 400 ppi while conductivity reaches a plateau value for a weft yarn density above about 210 ppi for a Satin 5 construction.

By observation of the fabric structure, it appears that the actual weft yarn density in a Satin 10 construction is significantly higher compared to a Satin 5 for the same weft yarn setting on the machine. This fact, in correlation with the longer conductive lines formed in Satin 10, may provide for distortion of the conductive portions from straight lines as well as touching or crossing between the conductive segments, when the fabric is in a relaxed state, which can have an influence on the fabric conductivity.

Example 10

A woven fabric was made (GVA-C-9) as in Example 9 and fabric GVA-C-11 with the difference that this fabric has a satin 16 construction (38 in FIG. 3G). A higher satin construction results in a higher actual weft yarn density for the same machine setting, in this case 496 ppi in Satin 16 versus 398 ppi for Satin 10. This result is analogous to the observations made in Example 9 in the comparison between Satin 10 and Satin 5 constructions. The $Q_u$ value for the metallic side of the fabric was 68.6-95.7, while for the fabric face was 62. Both of these values are significantly lower than the fabric GVA-C-11 under the same parameters, which reinforces the conclusions reached in the discussion of Example 9 that the higher the order of Satin construction appears to lead to a lower conductivity.

Example 11

A woven fabric was made (GVA-C-8) as in Example 3 with the difference being that this fabric has a satin 16+toile construction (40 in FIG. 3H) in the weft direction and a toile construction in the warp direction. The Q value of this fabric of Example 11 was 94.9 on the metallic face and 73.7 on the fabric face. By comparing the actual weft yarn density of this fabric (177 ppi) versus the similar Satin 5 construction (Example 3, 201 ppi) and Satin 10 construction (Example 8, 335 ppi), it appears that it is possible to control the spacing between the conductive yarns while having the possibility of long conductive segments, as allowed by a Satin 16 construction. The measured $Q_u$ values of this fabric with respect to the actual weft yarn density in FIG. 11, shows that this sample (i.e., Example 11) does not present a higher conductivity value compared to the Satin 5 construction when compared at the same actual weft yarn density. However, the conductivity of this fabric (Example 11) is improved compared to that of Example 10 that is of a Satin 16 construction and has a significantly higher weft yarn density.

The long conductive segments of the Satin 16+Toile weave construction form bended loops when the fabric is in a relaxed state that may have an influence in the conductivity efficiency of the fabric. The addition of the toile construction allows these loops to be significantly controlled compared to the simple Satin 16 construction. It appears that there is an opti-

TABLE 2

Example 9: Satin 10 construction: Effect of Weft Yarn Density

| Sample ID # | Weave | Yarns | | Yarn Density on Machine | | Yarn Density on Fabric | | Qu @2.6 GigaHertz (GHz) Microstrip Method | |
|---|---|---|---|---|---|---|---|---|---|
| | | Warp Yarn | Weft Yarn | Warp (ends/in) | Weft (picks/in) | Warp (ends/in) | Weft (picks/in) | Metal Side | Fabric Side |
| GVA-C-10 | Satin 10 | Cordura/Lycra ® | Ag—Cu 40 um TW-0 | 152 | 76 | 152 | 227 | 81-108 | 59 |
| GVA-C-12 | Satin 10 | Cordura/Lycra ® | Ag—Cu 40 um TW-0 | 152 | 147 | 152 | 335 | 100.5 | 68.1 |
| GVA-C-11 | Satin 10 | Cordura/Lycra ® | Ag—Cu 40 um TW-0 | 152 | 203 | 152 | 398 | 114.6 | 72.4 | mum point at which the high metal to non-metal ratio on one side of the fabric contributes to the fabric conductivity, which will depend on the mechanical properties of the yarns used and the fabric tension chosen.

Comparative Example 2

Fibers based on X-Static silver-plated nylon yarn obtained from Sauqoit Industries Inc., USA, were placed in a fixture parallel to each other. The yarn was a 2-ply yarn of 70 den containing 34 filaments, the individual fibers had a diameter of about 20-25 µm, and silver content of about 15%. The spacing between fibers was set to 0.508 mm, and the total number of parallel fibers was 40. The conductivity of the fibers at high frequency was measured via a high-Q waveguide cavity based measurement technique. The conductivity of the fibers at a frequency of 11.4 GHz was evaluated to be 4.5e+4 S/m ($Q_u$=2204.7) (Table 4).

Example 12

A similar set-up and measurement technique to that of Comparative Example 2 was made, only the fibers evaluated were silver-plated copper fibers obtained from Pelikan Wire, USA. These were monofilament fibers characterized by a diameter of 127 µm. The conductivity of the fibers at a frequency of 11.4 GHz was evaluated to be 1.5e+7 S/m ($Q_u$=5158) (Table 4). The conductivity exhibited by the conductive fibers of this Example 12 is far superior to the conductivity of the metal plated synthetic fiber of Comparative Example 2. This observation is quite surprising taking into account that both fibers exhibit excellent conductivity in the DC and low frequency range. Also, the pattern and relative total size of the yarns is similar so as not to account for such a big difference.

Comparative Example 3

A woven fabric (TRL-C-1b) was made based on plain weave construction having as warp yarn Nylon 70den fibers, a non-elastic yarn. The weft yarn was an elastic electrically conductive yarn. This yarn was produced via a conventional textile process for double covering whereby an elastic core member made of Lycra® fiber was wrapped by two X-Static® yarns, as described in Comparative Example 2. Covering was done on an I.C.B.T. machine model G307. During this process, Lycra® spandex fiber of 78 dtex was drafted to a value 3.8 times its original length and was then wrapped with two X-Static yarns of the same type, one twisted to the "S" (i.e., first covering) and the other "Z" (i.e., second covering) direction to produce an electrical conductive composite yarn.

The terms "S" and "Z" are common terminology in covered yarns made via a double-covering process. In the double-covering process, there is a straight core filament in the center surrounded by one twisted filament that is wrapped around in one direction (i.e., the "S" direction) and a second twisted filament wrapped around the core filament in the opposite direction (i.e., the "Z" direction). FIG. 12 shows a double-covered yarn having a first covering wrapped in the "S" direction and a second covering wrapped in the "Z" direction. One more filament could be added wrapped in the opposite direction (i.e., the "Z" direction) to create a double-covered yarn.

The yarn density measured on a loom machine for this fabric was: warp 102 ends/in and weft 80 picks/in. The Q value of this fabric, measured via the microstrip resonator method, was 32.1 from one side of the fabric and 39.7 from the other side of the fabric.

Example 13

A woven fabric (TRL-C-2) was made similar to the fabric disclosed in Comparative Example 3, with the only difference being in the weft yarn. The weft yarn for this fabric was an elastic electrically conductive composite yarn having an elastic core made of a Lycra® spandex single covered with a fine Silver-plated copper metal. This elastic yarn was produced on an I.C.B.T. machine model G307 whereby Lycra® spandex fiber type T-400 of 167 dtex and 34 filaments was wrapped by one metal wire of 40 µm diameter twisted in the "S" direction. The Q value for this fabric measured via the microstrip resonator measurement was 83.1 from one side of the fabric and 83.5 from the other side of the fabric.

By numerical simulation of the conductivity value of the fabric based on the measured $Q_u$ value (i.e., see FIG. 9), the conductivity of this electro-textile fabric is significantly higher (i.e., by more than one order of magnitude) as compared to the conductivity of the electro-textile fabric of Comparative Example 3.

As the two fabrics differ in the conductive yarn, this demonstrates that the yarn based on metal wire provides a significant higher conductivity compared to the yarn based on X-Static®. These observations are similar to the observations made between Example 12 and its Comparative Example 2 in the comparison between pure fibers based on metal wire and X-Static®. This is surprising in that the metal wire used in this Example 13 is of further smaller diameter than that in Example 12. Further, the conductive yarn of Comparative Example 3 is bulkier than the conductive yarn of Example 12. This bulkier yarn ensures a smaller spacing between the conductive yarns of Comparative Example 3 versus those of Example 13, and therefore a higher conductivity would be expected. Although such expectation might be true in the DC or low frequency range, this Example 13 shows that it is not true in the high frequency range.

Example 14

A woven fabric (TRL-C-3) was made similar to Comparative Example 3 and Example 13 that had yet a different weft yarn. The weft yarn for this fabric was a Lycra® fiber type T-902C of 330 dtex double covered with a fine Silver-plated copper metal wire of 40 µm diameter, as the one used in Example 2. This elastic yarn was produced on an I.C.B.T. machine model G307 whereby Lycra® fiber was drafted to 5 times its original length and then wrapped by the metal wire in the S direction and by a Nylon fiber of 22 dtex/7 filament in the Z direction. The Q value for this fabric measured via the microstrip resonator measurement was 64.8 from one side of the fabric and 63.2 from the other side of the fabric. These Q values are significantly higher compared to the Q value of the fabric of Comparative Example 3.

The comparisons between Examples 13 and 14 and Comparative Example 3 show that the biggest impact on the fabric conductivity arises from the nature of the conductive member of the composite yarn structure, which further leads to the preference of the metal wire versus the X-Static® yarn. Further comparison between Examples 13 and 14 indicates that the conductivity of the fabric of Example 13 is significantly higher than that of the fabric of Example 14. Although both Examples have the same weft yarn density, the fabric of Example 13 has a significantly higher metallic content on the surface of the fabric compared to Example 14. This difference in the metallic content originates from: (i) the construction of the weft yarn in Example 13, where the metal wire is totally in the exterior of the yarn, while in Example 14, the metal wire locates in the middle of the yarn components; and (ii) the weft yarn of Example 14 has higher elongation range that is expected to create a higher nominal density of warp yarns for the same fabric area when the fabric is removed from the loom and let relaxed. Both of these factors lead to important design parameters as it dictates the conductivity efficiency of the fabric. However, they also indicate that it is possible to construct an elastic fabric based on elastic conductive yarns that exhibit a high conductivity across frequencies including the high frequency range. This fabric can lead to high flexibility, be comfortable during wear and also allows for conformability around irregular or 3-dimensional objects, such as specific areas of the human body (e.g., shoulder, arm, etc.) or furniture.

Comparative Example 4

A woven fabric (GVA-C-27) was made similar to Example 2 that had a different weft yarn. The weft yarn for this fabric was an X-Static® yarn as the one used in Comparative Example 2. The Qu of this fabric measured via the microstrip resonator measurement was 35.0 from one side of the fabric and 35.7 from the other side of the fabric. There values are significantly lower as compared to the Qu value of the fabric of Example 2.

The conductive yarn was different in the fabrics of Comparative Example 4 and Example 2. A metal wire of 40 μm provides significant advantage over the multifilament metal plated yarn. Even if the actual yarn density is considered (i.e., see Table 5), this fabric has a much lower conductivity than any other fabric made under the examples of this Invention under the same conditions. Another surprising observation is that this fabric exhibits a symmetric conductivity behavior despite its structure that is based on a Satin 5 weave.

Comparative Example 5

A woven fabric (GVA-C-28) was made similar to Example 2 but had a different weft yarn. The weft yarn for this fabric was a Polyester/Stainless Steel spun yarn obtained from Sprint Metal, France. The yarn was a spun yarn of 400 dtex and was composed of 80% polyester and 20% of stainless steel AISI 316L that had a stainless steel filament of 8 μm. The $Q_u$ of this fabric measured via the microstrip resonator measurement was 10.5 from one side of the fabric and 17.0 from the other side of the fabric. This $Q_u$ value was significantly lower, as compared to the $Q_u$ value of the fabric of Example 2, and even significantly lower compared to the $Q_u$ value of Comparative Example 4. By considering the actual weft yarn density of this fabric (i.e., 106 ppi), this fabric does have a lower actual conductive yarn density compared to either Example 2 (173 ppi) or Comparative Example 4 (130 ppi). The bulkiness of this yarn does not allow for a high conductive yarn density, which limits the actual metal content of the fabric and therefore the conductivity of the fabric.

Example 15

A woven fabric (GVA-C-26) was made similar to Example 2, but had a different weft yarn. The weft yarn for this fabric was a flat metal wire obtained from Rea Magnet Wire Company, Inc., USA. The yarn had a size of 40 μm thickness×210 μm width. The $Q_u$ of this fabric, measured via the microstrip resonator measurement, was 111.8 from one side of the fabric and 86.0 from the other side of the fabric. The conductivity exhibited by this fabric is significantly higher than the fabric of Example 2, which was based on a metal wire of 40 μm diameter, even though its actual weft yarn density (136 ppi) is lower than that of Example 2 (173 ppi). It appears that the flat cross-section of this fiber compared to the metal wire of Example 2 contributes to a significant increase in the fabric conductivity.

Example 16

A woven fabric (GVA-C-23) was made similar to Example 2, but had a different weft yarn. The weft yarn for this fabric was an Aracon® yarn type XS0200E-025 obtained from E. I. du Pont de Nemours and Company, Wilmington, Del., USA. This was a silver-plated Kevlar® yarn of 780 dtex, where the thickness of silver plating was 38 μm and the filament diameter was 25 μm. The Qu of this fabric, measured via the microstrip resonator measurement, was 76.6 from one side of the fabric and 61.1 from the other side of the fabric. This fabric shows a lower conductivity than the fabric of Example 2.

However, it also shows a lower actual conductive yarn density. Compared under the same actual yarn density as Example 1, these results show that the conductivity behavior at high frequencies obtained via a metal wire of 40 um is better than that obtained from the metallized yarn of this Example 16.

Example 17

A woven fabric (GVA-C-25) was made similar to Example 4 under a weft yarn density of 46 ppi that had a different weft yarn. The weft yarn for this fabric was a Litz wire obtained from Elektro-Feindraht AG, Switzerland. This wire was constructed by 60 metal wires of 40 μm diameter. The QU of this fabric, measured via the microstrip resonator measurement, was 62.0 from one side of the fabric and 44.3 from the other side of the fabric, which is significantly lower than the conductivity of Example 4. Due to the higher thickness of the Litz wire of this Example compared to the single metal wire of Example 4, the actual weft yarn density of this fabric (67 ppi) is significantly lower than that of Example 4 (145 ppi). However, even at this low conductive yarn density, this fabric presents a higher conductivity compared to either Comparative Examples 4 or 5 that had 130 ppi and 106 ppi yarn densities, respectively.

Example 18

A woven fabric (C5) was made based on a plain weave construction. The fabric has as warp yarn a cotton Ne 40/1 yarn and as weft yarn a silver-plated copper wire of 127 μm diameter. The yarn density measured on the machine for this fabric was: warp 96 ends/in and weft 45 picks/in. The Q value of this fabric, measured via the microstrip resonator measurement, was 66.53 from one side of the fabric and 77.9 from the other side of the fabric. This value is significantly higher than the Q value of the fabric of Comparative Example 1, although the conductive yarn density (i.e., in picks/in) is less than half that of the Comparative Example 1 fabric. Even if the yarn ratio per surface area of the fabric (defined as: (weft yarn density)/(weft yarn density+warp yarn density)) is calculated, the fabric of this Example 18 has a conductive yarn ratio of 31.9% compared to the Comparative Example 1 fabric of 40.2%. This shows that the higher the diameter of the metal wire, the less the yarn density is required to achieve the same conductivity.

Example 19

Figure 4A:
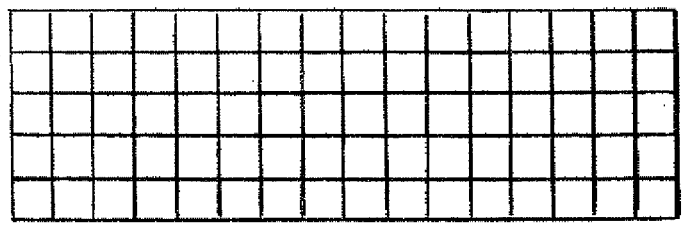
FIG. 4A shows the weave construction of the sample of Example 18.
Figure 4B:
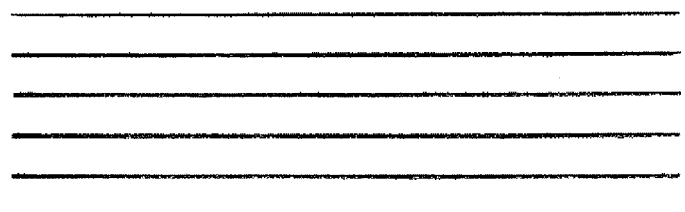
FIG. 4B shows the weave construction of the sample of Example 19.

Based on the woven fabric of Example 18, the warp threads of the fabric (i.e., cotton yarn) were removed via a mechanical means leaving only the weft yarns of the fabric (i.e., conductive yarns). That is, compare 50 in FIG. 4A with 52 in FIG. 4B showing the warp yarns removed. The value of Q, measured with the miscrostrip resonator measurement set-up, was 112.8. This is significantly higher than the Q value of 77.9 measured for the fabric, which indicates that the presence of warp yarns has a significant effect on conductivity. This can be due to the nature and properties of the warp yarns (i.e., cotton in this case), or due to the higher metallic content allowed by the removal of the interlaced yarns, analogous to the surprising results found between plain weave and satin weave construction, as discussed in the Examples above.

Example 20

Figure 4C:
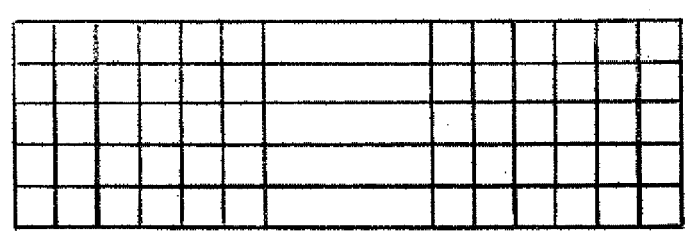
FIG. 4C shows the weave construction of the sample of Example 20.

Based on the woven fabric of Example 18, the warp threads of the fabric (i.e., cotton yarn) were removed in the middle section of the fabric to be measured via a mechanical means 54 in FIG. 4C. The value of Q, measured with the miscrostrip resonator measurement set-up, was 83.1. This is slightly higher than the Q value of 77.9 measured for the whole fabric, which indicates that the presence of warp yarns at the two ends of the fabric section has a slight effect on conductivity. A simple calculation based on the number ratio between weft (i.e., conductive) and warp (i.e., cotton) yarns indicates that Example 18 contains about 50% of weft yarns while Example 9 contains about 70% of weft yarns which may explain the slightly higher conductivity for this fabric.

Example 21

Figure 4D:
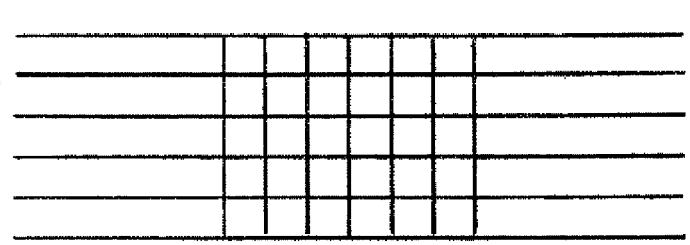
FIG. 4D shows the weave construction of the sample of Example 21.

Based on the woven fabric of Example 18, the warp threads of the fabric (i.e., cotton yarn) were removed via a mechanical means from the left and right sides of the fabric leaving the warp threads only in the middle section of the fabric to be measured (56 in FIG. 4D). The value of Q, measured with the miscrostrip resonator measurement set-up, was 107.9. This is significantly higher than the Q value of 77.9 measured for the whole fabric, which indicates that the presence of warp yarns at the middle of the fabric section has a slight effect on conductivity versus a fabric based on pure metal yarns. A simple calculation indicates that the number ratio of weft yarns in this fabric is 83%, which is significantly higher than both Examples 18 and 20, and is much closer to Example 19 of the invention. Examples 20 and 21 indicate further that the conductivity of the fabric can be significantly increased by the choice of the warp yarn, and by the design of the fabric construction so as to increase the metallic yarn content on the surface of the fabric.

Comparative Example 6

A simple patch antenna was made having a copper plate as a ground plate, a middle dielectric layer made of Duroid 5880, and a top conductive layer of a fabric that had a very low conductivity with Q of 26.29, based on the microstrip resonator measurement method. The fabric was a plain weave construction. The design of the antenna was made so that it has a center frequency of 2.4 GigaHertz (GHz).

Figure 5:
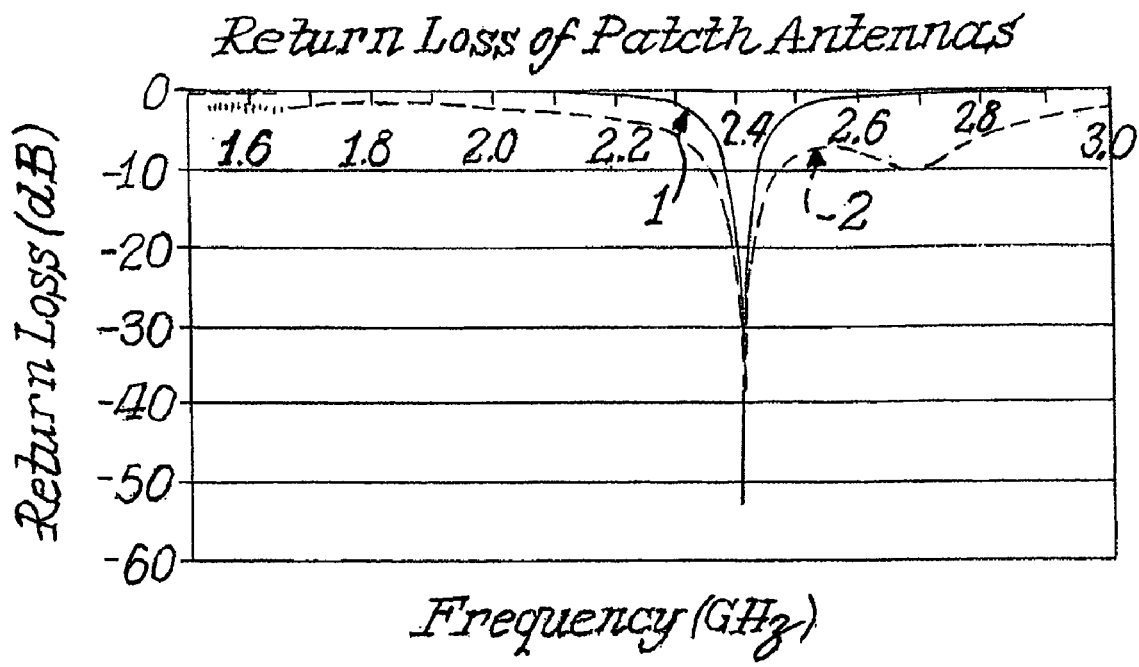
FIG. 5 is a graph of the return loss in decibels (dB) versus frequency in GigaHertz (GHz) of a known patch antenna and an antenna having, as a top layer, the fabric of Comparative Example 6.

A comparison between this antenna construction and a standard antenna that has a copper plate as the top layer instead of the fabric is shown in the graph of FIG. 5. This antenna of Comparative Example 6 showed a similar return loss pattern as the standard patch antenna, and each antenna had a bandwidth of 5.7%. However, the antenna of Comparative Example 6 showed quite a high out of band return loss of 2-3 dB compared to 0 dB for the standard antenna, and a low efficiency of around 40% compared to the standard antenna that has an efficiency of around 80%.

Example 22

A simple patch antenna was made as in the Comparative Example 6, but the top conductive layer was the fabric GVA-C-2 described in Example 5 of the present invention. This fabric was of a Satin 5 weave construction. This fabric had a significantly higher conductivity compared to the fabric used in Comparative Example 6. FIG. 6 shows the response for a fabric antenna of Example 22 that was designed for operation at 2.4 GHz. In addition, the fabric antenna presents 2 additional resonant frequencies in the frequency range between 2.4 and 3 GHz. Therefore, if the wireless communication signal was to set in the frequency range above 2.4 GHz this fabric antenna could still act as antenna in this frequency range. This antenna of Example 22 showed an out of band return loss of about 0.3 dB, which is significantly lower than that measured for Comparative Example 6, and a bandwidth of 2%. It also presented several resonances next to the center frequency of 2.4 GigaHertz (GHz) including a significant resonant mode above 2.7 GigaHertz (GHz).

Example 23

Figure 7:
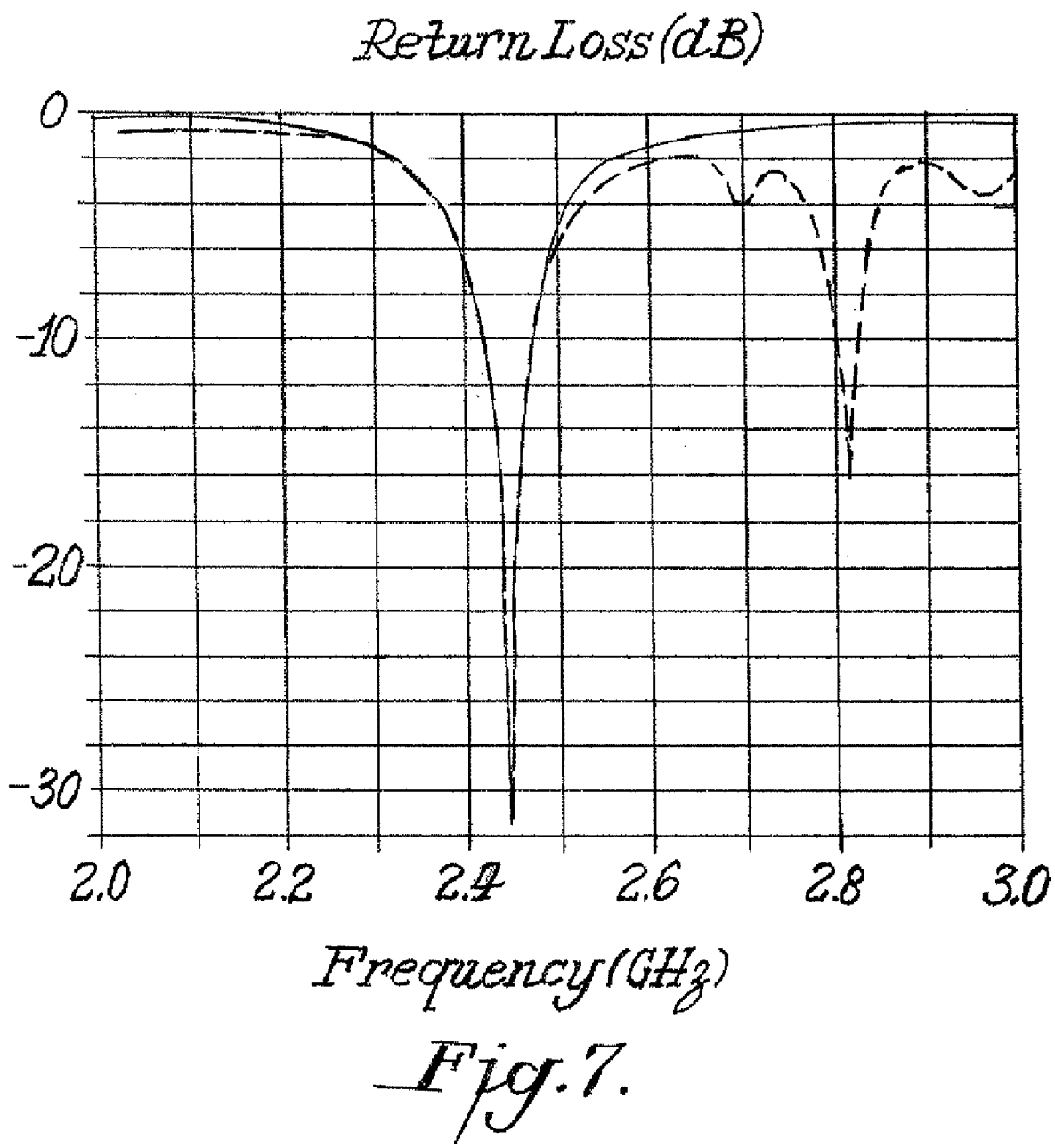
FIG. 7 is a graph of the return loss in decibels (dB) versus frequency in GigaHertz (GHz) of two samples of a patch antenna of Example 11 according to the present invention, as compared with two samples of a known patch antenna.

A simple patch antenna was made as in Comparative Example 6, but the top conductive layer was the fabric GVA-C-5 described in Example 3 of the Invention. This fabric was of a Satin 5 weave construction. This fabric had a significantly higher conductivity compared to that used in Comparative Example 6, and also had a higher conductivity compared to the fabric used in Example 22. The response of this antenna is shown in the graph in FIG. 7. This antenna of Example 23 showed an out of band return loss of about 0.3 dB, which is significantly lower than that measured in Comparative Example 6 and comparable to Example 22, a bandwidth of 2.6%. It also presented several resonances next to the center frequency of 2.4 GigaHertz (GHz), including a significant resonant mode above 2.7 GigaHertz (GHz) similar to the observations with Example 22. The antenna gain of a standard patch antenna was 7.07 dB, and two samples of the patch antenna of this Example 23 showed a gain of 6.69 dB and 6.07 dB, respectively. By comparing the standard patch antenna, which has 99% efficiency, the efficiency of the antenna of this Example 23 was 90.7%.

The antenna of this Example 23 shows a very similar pattern to a standard patch antenna. This is an excellent demonstration of the surprising fact that the fabric of the invention has shown such a high efficiency as an antenna in the high frequency range that it is equivalent to a standard "hard" antenna used in the electronics industry today.

Example 24

Figure 8:
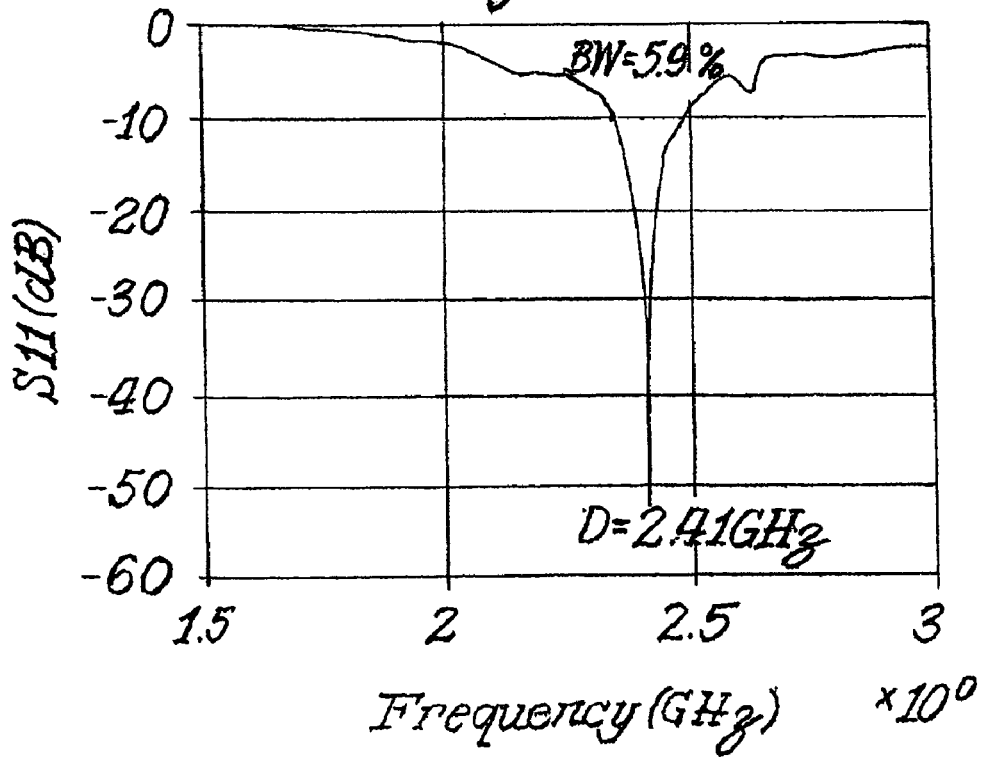
FIG. 8 is a graph of the return loss in decibels (dB) versus frequency in GigaHertz (GHz) of the fabric patch antenna of Example 24 according to the present invention.

A fully fabric patch antenna was made having as top and ground conductive layers the fabric GVA-C-2 described in Example 5 and as a middle dielectric layer a 100% polyester woven fabric. FIG. 8 is a graph of return loss versus frequency. FIG. 8 shows the return loss of the fully fabric antenna. The antenna of Example 24 shows a 0.8 dB out of band return loss, and a bandwidth of 5.9%. There is a small extra resonance observed at a higher frequency than the center frequency. The efficiency of the antenna of Example 24 is at least 60%.

For ease of reference, Tables 3, 4 and 5 below summarize the weave or knit constructions and compositions of various Examples.

Nothing in this specification should be considered as limiting the scope of the present invention. All examples presented are representative and non-limiting. The above described embodiments of the invention may be modified or varied, and elements added or omitted, without departing from the invention, as appreciated by persons skilled in the art in light of the above teachings. It is therefore to be understood that the invention is to be measured by the scope of the claims, and may be practiced in alternative manners to those which have been specifically described in the specification.

TABLE 3

Woven Fabric Example Samples: Identification of Textile Parameters and Measured Conductivity Values

| Sample ID # | Weave | Warp Yarn | Weft Yarn | Yarn Density on Machine Warp (ends/in) | Yarn Density on Machine Weft (picks/in) | Yarn Density on Fabric Warp (ends/in) | Yarn Density on Fabric Weft (picks/in) | $Q_u$ @2.6 GigaHertz (GHz) Microstrip Method Metal Side | $Q_u$ @2.6 GigaHertz (GHz) Microstrip Method Fabric Side |
|---|---|---|---|---|---|---|---|---|---|
| Copper | Copper Plate | — | — | — | — | — | — | 142 | 142 |
| GVA-C-1 Comparative 1 | Plain Weave | Cotton Ne 100/2 (60 dtex) | Ag—Cu 40 um TW-0 (125dtex) | 152 | 102 | 152 | 102 | 14.4 | 14.4 |
| GVA-C-20 Example 1 | Plain Weave | Cordura/Lycra ® | Ag—Cu 40 um TW-0 | 152 | 76 | 152 | 117 | 84.5 | 84.1 |
| GVA-C-17 Example 2 | Satin 5 | Cordura/Lycra ® | Ag—Cu 40 um TW-0 | 152 | 76 | 152 | 173 | 108.2 | 69.3 |
| GVA-C-5 Example 3 | Satin 5 | Cordura/Lycra ® | Ag—Cu 40 um TW-0 | 152 | 147 | 152 | 201 | 114.9 | 81.2 |
| GVA-C-2 Example 5 | Satin 5 | Cotton Ne 100/2 | Ag—Cu 40 um TW-0 | 152 | 147 | 152 | 147 | 92.3 | 76.2 |
| GVA-C-4 Example 6 | Double Face Satin 4 | Cordura/Lycra ® | Ag—Cu 40 um TW-0 | 152 | 147 | 152 | 218 | 98.0 | 72.6 |
| GVA-C-13 Example 7 | Double Face Satin 4 | Cordura/Lycra ® | Ag—Cu 40 um TW-0 | 152 | 147 | 152 | 254 | 98.6 | 99.8 |
| GVA-C-12 Example 8 | Satin 10 | Cordura/Lycra ® | Ag—Cu 40 um TW-0 | 152 | 147 | 152 | 335 | 100.5 | 68.1 |
| GVA-C-9 Example 10 | Satin 16 | Cordura/Lycra ® | Ag—Cu 40 um TW-0 | 152 | 203 | 152 | 496 | 68.6-95.7 | 62 |
| GVA-C-8 Example 11 | Satin 16 toile (weft) + Toile (warp) | Cordura/Lycra ® | Ag—Cu 40 um TW-0 | 152 | 147 | 152 | 177 | 94.9 | 73.7 |
| GVA-C-9 | Satin 16 | Cordura/Lycra ® | Ag—Cu 40 um TW-0 | 152 | 203 | 152 | 496 | 68.6-95.7 | 62 |
| C5 Example | Plain Weave | Cotton 40/1 cc (148 dtex) | Bare Ag—Cu Wire 127 um (1176 dtex) | 96 | 45 | 96 | 45 | 66.5 | 77.9 |
| TRL-C-1b Comparative 3 | Plain Weave | Nylon 70 den | DC 900/666 Lycra ® 78 dtex 3.8x/X-Static | 102 | 80 | — | — | 32.1 | 39.7 |
| TRL-C-2 Example 13 | Plain Weave | Nylon 70 den | SC 1800tpm T-400 167 dtex/40 um TW0 | 102 | 80 | — | — | 83.1 | 83.5 |
| TRL-C-3 Example 14 | Plain Weave | Nylon 70 den | DC 1500/1200 Lycra ® 330 dtex 5x/40 um TWO/ PA 22/7 | 102 | 80 | — | — | 64.8 | 63.2 |

TABLE 4

Pure Metal Fibers Example Samples: Identification of Parameters and Measured Conductivity Values

| Sample ID # | Construction | Knitted Yarns | Conductivity, S/m ($Q_u$) @ 11.4 GigaHertz (GHz) Cavity Method Horizontal Vertical | $Q_u$ @ 11.4 GigaHertz (GHz) Cavity Method |
|---|---|---|---|---|
| Ag—Cu Metal Wire | Parallel Fibers spacing 0.508 mm | Bare Ag—Cu Metal Wire (d = 127 um) | 1.5e+07 (5158) | 5158 |
| X-Static ® | Parallel Fibers spacing 0.508 mm | X-Static ® | 4.5e+04 (2204.7) | 2204.7 |

TABLE 5

Satin 5 construction: Effect of Weft Conductive Yarn

| | | | | Yarn Density on Machine | | Yarn Density on Fabric | | Qu @2.6 GigaHertz (GHz) Microstrip Method | |
|---|---|---|---|---|---|---|---|---|---|
| | | Yarns | | Warp | Weft | Warp | Weft | Metal | Fabric |
| Sample ID # | Construction | Warp Yarn | Weft Yarn | (ends/in) | (picks/in) | (ends/in) | (picks/in) | Side | Side |
| GVA-C-17 Example 2 | Satin 5 | Cordura/Lycra ® | Ag—Cu 40 um TW-0 | 152 | 76 | 152 | 173 | 108.2 | 69.3 |
| GVA-C-20 Example 1 | Plain Weave | Cordura/Lycra ® | Ag—Cu 40 um TW-0 | 152 | 76 | 152 | 117 | 84.5 | 84.1 |
| GVA-C-27 Comparative 4 | Satin 5 | Cordura/Lycra ® | X-Static 70-xs-34x2 tex5z | 152 | 76 | 152 | 130 | 35.0 | 35.7 |
| GVA-C-28 Comparative 5 | Satin 5 | Cordura/Lycra ® | Polyester/Stainless Steel 80/20 | 152 | 76 | 152 | 106 | 10.5 | 17.0 |
| GVA-C-26 Example 15 | Satin 5 | Cordura/Lycra ® | Metal Foil | 152 | 76 | 152 | 136 | 111.8 | 86.0 |
| GVA-C-23 Example 16 | Satin 5 | Cordura/Lycra ® | Aracon ® XS0200E-025 | 152 | 76 | 152 | 117 | 76.6 | 61.1 |
| GVA-C-21 Example 4 | Satin 5 | Cordura/Lycra ® | Ag—Cu 40 um TW-0 | 152 | 46 | 152 | 145 | 85.1-97.3 | 55.9-73 |
| GVA-C-25 Example 17 | Satin 5 | Cordura/Lycra ® | Litz Wire (60x Ag—Cu 40 um TW-0 | 152 | 46 | 152 | 67 | 62.0 | 44.3 |

The invention claimed is:

1. A method of modulating functionality of an electro-textile fabric comprising:
   incorporating a plurality of non-conductive textile filaments and a plurality of energy-active functional filaments into a weaving apparatus;
   integrating the non-conductive textile filaments and the energy-active functional filaments by weaving into the electro-textile fabric in accordance with a weave pattern selected from the group consisting of: satin, twill, rib, basket weave, double face construction, and any derivative based on these, resulting in floats of energy-active functional filaments on at least a first surface of the electro-textile fabric, wherein at least one of the non-conductive textile filaments and the energy-active functional filaments is elastic; and
   selectively removing from the electro-textile fabric at least one of the energy-active functional filaments or the non-conductive filaments to isolate at least one electrical pathway.

2. The method of claim 1, wherein a higher concentration of floats of energy-active functional filaments is incorporated in one surface of the electro-textile fabric than another surface of the electro-textile fabric.

3. The method of claim 2, wherein a higher concentration of floats of energy-active functional filaments than the concentration of floats of non-conductive textile filaments is incorporated on both surfaces of the electro-textile fabric.

4. The method of claim 1, wherein the ratio of number of weft filaments density to number of total filaments density (weft plus warp) is at least 30%.

5. The method of claim 1, wherein floats of non-conductive textile filaments are formed between the floats of energy-active functional filaments.

6. The method of claim 1, wherein an asymmetric number of floats of weft filaments and an asymmetric number of floats of warp filaments are formed on both surfaces of the electro-textile fabric.

7. The method of claim 1, further comprising:
   treating the electro-textile fabric with vapor; and
   heat setting the electro-textile fabric.

8. The method of claim 1, further comprising:
   stretching and relaxing the electro-textile fabric.

* * * * *